United States Patent [19]
Lee et al.

[11] Patent Number: 4,868,447
[45] Date of Patent: Sep. 19, 1989

[54] PIEZOELECTRIC POLYMER LAMINATES FOR TORSIONAL AND BENDING MODAL CONTROL

[75] Inventors: Chih-Kung Lee, Sunnyvale, Calif.; Francis C. Moon, Ithaca, N.Y.

[73] Assignee: Cornell Research Foundation, Inc., Ithaca, N.Y.

[21] Appl. No.: 95,494

[22] Filed: Sep. 11, 1987

[51] Int. Cl.$^4$ .................................................. H01L 41/08
[52] U.S. Cl. ..................................... 310/328; 310/316; 310/330; 310/331; 310/332; 310/357; 310/358; 310/359; 310/365; 310/360; 310/800; 310/338; 310/339

[58] Field of Search ................. 310/316, 317, 321–324, 310/328, 330–332, 357–359, 365, 366, 800, 338, 339; 73/862.04, 862.08, 423 T; 901/30–36, 45, 46, 50

[56] References Cited

U.S. PATENT DOCUMENTS

| | | | |
|---|---|---|---|
| 3,035,126 | 5/1962 | Crowrover | 310/333 |
| 3,219,850 | 11/1965 | Langevin | 310/333 |
| 3,247,404 | 4/1966 | Batsch | 310/331 |
| 3,422,371 | 1/1969 | Poirer et al. | 310/800 X |
| 3,526,726 | 9/1970 | Corbett et al. | 310/331 X |
| 3,582,691 | 6/1971 | Sonderegger | 310/338 |
| 3,614,488 | 10/1971 | Sonderegger | 310/333 |
| 3,894,198 | 7/1975 | Murayama et al. | 310/800 X |
| 4,087,715 | 5/1978 | Myer | 310/328 X |
| 4,330,730 | 5/1982 | Kurz et al. | 310/800 X |
| 4,363,991 | 12/1982 | Edelman | 310/800 X |
| 4,400,642 | 8/1983 | Kiraly | 310/332 X |
| 4,460,841 | 7/1984 | Smith | 310/365 X |
| 4,523,120 | 6/1985 | Assard et al. | 310/328 X |
| 4,545,553 | 10/1985 | Finke et al. | 310/800 X |
| 4,555,953 | 12/1985 | Dario et al. | 310/800 X |
| 4,565,940 | 1/1986 | Hubbard, Jr. | 310/800 |
| 4,590,399 | 5/1986 | Roxlo et al. | 310/800 X |
| 4,627,138 | 12/1986 | Im | 310/800 X |
| 4,689,992 | 9/1987 | Strachan | 310/800 X |

OTHER PUBLICATIONS

Toda, M., "Theory of Air Flow Generation by a Resonant Type PVF$_2$ Bimorph Cantilever Vibrator," Ferroelectrics, vol. 22, pp. 911–918, (1979).

Bailey, T., and J. E. Hubbard, "Distributed Piezoelectric-Polymer Active Vibration Control of a Cantilever Beam," J. Guid. and Contr., vol. 8, No. 5, pp. 605–611, (1985).

Meirovitch, L., H. Baruh, R. C. Montgomery and J. P. Williams, "Nonlinear Control of an Experimental Beam by IMSC," AIAA, Preprint 83-0855.

Kawai, H., "The Piezoelectricity of Poly(Vinylidene Fluoride)," Jpn. J. Appl. Phys., vol. 8, pp. 975–976, (1969).

Linvill, J. G., "PVF$_2$ Model, Measurements and Devices," Ferroelectrics, vol. 28, pp. 291–296, (1980).

Toda, M., "A PVF$_2$ Piezoelectric Bimorph Device for Sensing Presence and Position of Other Objects," IEEE Trans. Electro. Dev., vol. ED-26, No. 5, pp. 815–817, (1979).

(List continued on next page.)

Primary Examiner—Mark O. Budd
Attorney, Agent, or Firm—Jones, Tullar & Cooper

[57] ABSTRACT

Laminates of polyvinylidene fluroride (PVDF) are employed as piezoelectric sensors and actuators which can sense and/or generate complex motions that include bending, stretching, and twisting components. The laminates can be attached directly to a mechanical structure whose motions are to be sensed and/or controlled. By skewing the principal axes of each of the lamina in the laminate with respect to one another, the laminate is responsive not only to bending motions, but to torsional motions as well. Surface electrodes are disposed on the top and bottom sides of each of the lamina to either sense voltage generated by the lamina in response to motion imparted thereto, or supply voltage to the lamina to induce motion therein. The shape of the surface electrode patterns can be varied to control the particular components of motion to which each of the lamina is responsive (e.g., bending modes). The polarization profile in each of the lamina can also be varied for this purpose. Mechanical oscillators and dampers can be constructed using the laminates.

54 Claims, 14 Drawing Sheets

OTHER PUBLICATIONS

Oz. H. and L. Meirovitch, "Optimal Modal-Space Control of Flexible Gyroscopic Systems," J. Guid. and Contr., vol. 3, No. 3, pp. 218–226, (1980).

Meirovitch, L. and H. Baruch, "Control of Self-Adjoint Distributed-Paramter Systems," J. Guid. and Contr., vol. 5, No. 1, pp. 60–66, (1982).

Meirovitch, L. and H. Baruh, "The Implementation of Modal Filters for Control of Structures," J. Guid. and Contr., vol. 8, No. 6, pp. 707–716, Nov.–Dec., (1985).

Latour, M. and P. V. Murphy, "Application of $PVF_2$ Transducers as Piezoelectric Vibrators for Marine Fouling Prevention," Ferroelectrics, vol. 32, pp. 33–37, (1981).

Plump, J., J. E. Hubbard and T. Bailey, "Nonlinear Control of a Distributed System: Simulation and Experimental Results," presented at the 1985 ASME Winter Annual Meeting.

Burke, S. and J. E. Hubbard, "Distributed Parameter Control Design for Vibrating Beams Using Generalized Functions," presented at the 1986 IFAC Symposium on Control of Distributed Parameter Systems.

4(a)  4(b)

PIEZOELECTRIC POLYMER LAMINATES FOR TORSIONAL AND BENDING MODAL CONTROL

BACKGROUND OF THE INVENTION

The present invention relates, in general, to piezoelectric sensors and actuators constructed of polyvinylidene fluoride laminates for use in both sensing and controlling complex mechanical movements.

In 1969, H. Kawai, discovered that the organic polymer, polyvinylidene fluoride (PVDF), exhibits a strong piezoelectric effect. Recently, PVDF has been processed into thin films which are flexible and lightweight, and can be utilized to both sense and generate bending or flexing movements. As an example, in U.S. Pat. No. 4,565,940 to Hubbard, PVDF film was applied to a beam, and employed to control or dampen vibrations in the beam. Through the application in the film of a voltage of proper amplitude and phase, strain is induced in the film of appropriate phase, amplitude, and frequency, to dampen vibrations in the beam.

Although the Hubbard system works well for controlling simple bending motions or vibrations, it is not applicable for controlling more complex motions, which include not only bending, but stretching and torsional movements as well. This is because the PVDF film only generates normal stress and strain with respect to its principal axis when voltage is applied across its thickness direction. Consequently, only movement induced by normal stress or strain such as bending can be sensed or generated by the film. The present invention, on the other hand, provides integrated/distributed PVDF sensors and actuators which can be used to sense and control complex mechanical motions, or components of complex mechanical motions.

The possible applications of these sensors and actuators are endless. The construction and operation of large space structures, computer magnetic readers which have to match the rapid density increases in compact storage technology, etc., pose new and challenging active control problems. These structures are mechanically flexible because of their low rigidity and the low natural damping in light weight construction materials. Therefore, active feedback control becomes essential to the construction and operation of these structures. An important question in the control of flexible structures is whether it is possible to control the structure by means of on-board computers performing real-time computations. Therefore, the application of point sensors in the active control of flexible structures poses two problems. First, if only a few point sensors are installed, then there will not be enough information to reveal the system responses. Second, if a large number of sensors are installed, the on-board real time computation requirement becomes serious. A natural question that arises from this understanding is what is the possibility of fabricating some sort of integrated/distributed sensor which transfers the on-board real time computation efforts to the sensor design processes.

Similarly, the application of point actuators has its own problems. First, external actuators are not applicable for most free-fly space structures. Second, the number and the weight of actuators can affect the dynamics of a flexible structure. In other words, the proof-mass actuator is not an elegant way of changing the system dynamics of a flexible structure. The actuators possess the same requirements as the sensing aspects of the control algorithm. An integrated/distributed actuator could be the solution.

SUMMARY OF THE INVENTION

It is therefore a first object of the present invention to provide piezoelectric polymeric sensors and actuators that can sense and generate complex mechanical motions.

It is another object of the present invention to provide thin film polymeric sensors and actuators that can be attached directly to a mechanical system, such as a computer disk file suspension, and utilized to both control and monitor the complex movements of the mechanical system.

It is yet another object of the present invention to provide a polymeric sensor and actuator which can be designed to respond to and actuate specific bending modes in a mechanical system.

It is a still further object of the present invention to provide an integrated distributed piezoelectric sensor and actuator than can be designed specifically for the mechanical system to which it is to be attached, and can provide analysis and control of the complex motions of the mechanical system without the requirement of the extensive data processing that would be required with a system of point sensors and actuators.

These, and other objects of invention, are attained through the use of laminated PVDF structures, comprising a plurality of layers of PVDF films. In some embodiments, these layers are separated from one another by layers of shim metal, such as aluminum, stainless steel, or the like. Thin, flat nickel and aluminum electrodes are formed on the top and bottom surfaces of each PVDF lamina by any suitable process, such as by vacuum deposition, screen printing of conductive inks, etching, etc. A photolithographic process can be used to change the pattern of the surface electrodes for reasons to be discussed below.

Each of the PVDF lamina are adhered to the adjacent laminae with a thin layer of adhesive. This adhesive can be either conductive or nonconductive, depending on whether or not a direct electrical connection between the PVDF laminae and the shim metal layers is desired so that an electrical connection can be made to the shim metal, instead of directly to the surface electrodes.

When the PVDF films are manufactured, they are rolled to achieve a desired thickness. The direction in which they are rolled becomes their principal axis, or the axis along which the top side of the PVDF elongates or contracts relative to the bottom side when subjected to an electric field. Thus, if the principal axis is called the x axis, the poling direction will be the z axis (along the thickness of the film), and the axis about which the PVDF will bend, when a voltage is applied across the thickness of the film, will be the y axis.

As discussed previously, the above characteristics of PVDF film will only allow a single layer sensor/actuator to sense or generate bending motions about a single axis, or in this case, the y axis. To allow the sensor/actuator to sense and generate torsional motions, or motions about the x-axis, the adjacent PVDF laminae in the laminated sensor/actuator of the present invention have their principal axes skewed with respect to one another. The skew angle between the laminae permit each of the lamina to sense or generate different components of a complex motion. Thus, while a first lamina may only sense/generate bending motions about its y-axis, an adjacent lamina having its principal axis skewed with respect to that of the first lamina, will sense/generate motions that include not only a bending component about the y-axis of the first sensor/actuator, but a torsional component about the x-axis of the first sensor/actuator as well.

The electrical outputs/inputs of all of the PVDF laminae in the sensor/actuator can thus be combined so that, through use of any suitable computing device, a complex mechanical motion can be sensed or generated by the PVDF laminate. By attaching the laminate directly to a structure to be monitored or controlled, e.g., a computer disk file suspension, a structural beam, etc., the motions of the structure can be monitored and controlled without the need for extensive data processing, since the PVDF laminate forms a integrated/distributed sensor/actuator, that, unlike a plurality of point sensors and actuators, either provides only a single electrical output, or requires only a single input. Although fairly extensive processing is needed to properly design the PVDF laminate for the particular application for which it is intended, there is no requirement for extensive real time computations to be carried out once the PVDF laminate sensor/actuator is in place and operating.

As stated previously, there are endless applications for the present invention. One such application is the monitoring and control of the complex vibrations generated by the suspension of a computer disk reading mechanism. When information is read off of a computer disk by a laser read head, the read head must follow the contours (i.e., peaks and valleys) of the disk very precisely, and must be maintained at a constant minute distance (e.g., 1 micron) from the disk. Clearly, the suspension on which the read head is disposed, must be controlled by a complex and precise mechanical mechanism. The laminated PVDF sensor/actuator is well suited for this purpose. With the laminate adhered directly to the suspension, both the bending and torsional movements of the suspension can be monitored by sensing the voltages generated by the PVDF laminae. In response to these sensed signals, voltage signals can be sent back to the laminae to induce bending and torsional movements in the laminate, and therefore in the suspension, to compensate for any undesired motions in the suspension.

In addition to varying the skew angles between the PVDF laminae, there are a number of other ways in which the response characteristics of the sensor/actuator structure can be specifically tailored for a particular application. One way is by changing the shape or pattern of the surface electrodes which are disposed on the PVDF laminae, and are utilized to supply voltage to, and sense voltage generated by, the sensor/actuator. It has been discovered for example, that by shaping the electrode in a particular manner, the sensor can be made to respond to the individual bending modes that make up the motion of the mechanical system to which the sensor is attached. In other words, there is a direct relationship between the shape of the electrode pattern, and the motion components sensed or generated by the laminate. This property can also be taken advantage of through the shaping of the PVDF laminae themselves.

A third way in which the response characteristics of the sensor/actuator can be varied is by varying the polarization profile within the plane of the individual PVDF lamina. Each of the laminae are polarized during manufacture to make them piezoelectrically active. This polarization is attained through application of a strong external electric field to the PVDF. Normally, the laminae are uniaxially polarized. However, by polarizing one portion of the laminae is one direction, and another portion in an opposite direction, the response of the sensor/actuator to a voltage or strain stimulus can be significantly altered. In addition, the magnitude of the polarization can be varied throughout the area of the PVDF laminae to further tailor the response characteristics.

Thus, both the electrode surface pattern or PVDF lamina shape, as well the polarization profile in the PVDF lamina, have a direct relationship with the components of motion that are sensed or generated by the PVDF sensor/actuator. As will be explained in greater detail below, in order to sense or generate some motions, such as certain bending modes, it is required not only that the surface electrode be shaped according to a particular function, but also that the polarization profile be varied in the PVDF as well.

Another feature of the present invention is that the reciprocal relationship between PVDF sensors and actuators permits them to be employed in a self-contained, and energy efficient oscillator. The concept is similar to that used in the conventional crystal oscillator, where the electric signal generated by the determination of the piezoelectric crystal is amplified, and feedback is used to drive the crystal itself. More specifically, a PVDF sensor can be designed which picks up a particular aspect of the system's motion, say twisting motion for example. By using an amplifier to amplify the signal and send the amplified signal to drive the corresponding PVDF actuator, then the system will oscillate at that specific type of motion.

In a similar fashion, a PVDF sensor/actuator combination can be used for active damping of vibrations. The device set forth in the Hubbard patent mentioned previously, is an active vibration damper than employs a PVDF actuator. However, in the embodiments disclosed in Hubbard, point sensors, such as strain gauges or accelerometers, are used to sense the vibrations. In contrast, through the use of a PVDF laminate structure, the present invention provides an integrated sensor/actuator that can be employed to both sense and dampen vibrations in a mechanical structure.

BRIEF DESCRIPTION OF THE DRAWINGS

The foregoing objects, features, and advantages of the present invention will become apparent from a consideration of the following detailed description of preferred embodiments thereof taken in conjunction with the accompanying drawings, in which.

DETAILED DESCRIPTION OF THE PREFERRED EMBODIMENTS

Figure 1:
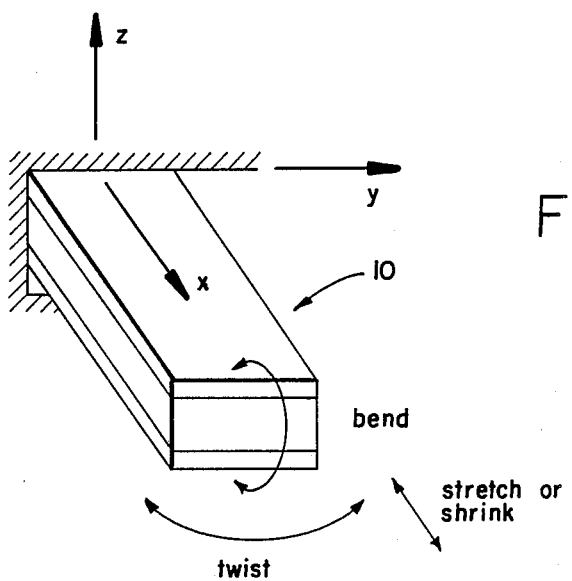
FIG. 1 is a schematic illustration of a slender plate showing its possible motions.

Turning now to a more detailed description of the present invention, there is illustrated in FIG. 1, a slender plate 10, the motions of which are to be sensed or controlled. As shown, the plate has three possible motions: bending, twisting, and stretching. Since beams and plates appear often in large space structures, compact disc suspensions, etc., it would be very useful to devise a mechanism, whereby the complete movements of plate 10, can be both sensed and controlled. Using a theory which incorporates the piezoelectric effect into the classical composite or laminate theory, the present invention achieves this goal through the use of PVDF laminates. By attaching the laminate directly to the plate or structure, and applying an electric field to the laminate, the structure motion can be controlled. Similarly, by detecting the electric displacement from each piezoelectric lamina, structure motion can be detected.

The theory of piezoelectric composition will now be set forth. Using the IEEE compact matrix notation, the constitutive equation of a piezoelectric material can be written in either of the following forms:

$$T_p = c^E_{pq}S_q - e_{kp}E_k, \tag{1}$$

$$D_i = e_{iq}S_q + \epsilon^S_{ik}E_k, \text{ or} \tag{2}$$

$$S_p = s^E_{pq}T_q + d_{ip}E_i, \tag{3}$$

$$D_i = d_{iq}T_q + \epsilon^T_{ij}E_k, \tag{4}$$

where the subscripts i, k=1, 2, 3 and p, q=1, 2, 3, 4, 5, 6. The superscript represents the field which remains constant, $T_p$ and $S_p$ represent stress and strain, respectively. $E_k$ represents electric field intensity. $D_i$ represents electric displacement, $c_{pq}$ represents the elastic stiffness matrix, $s_{pq}=(c_{pq})^{-1}$ represents the elastic stiffness matrix, $e_{ij}$ represents the permitivity matrix, and $d_{iq}$ represents the piezoelectric strain/charge matrix.

Figure 2:
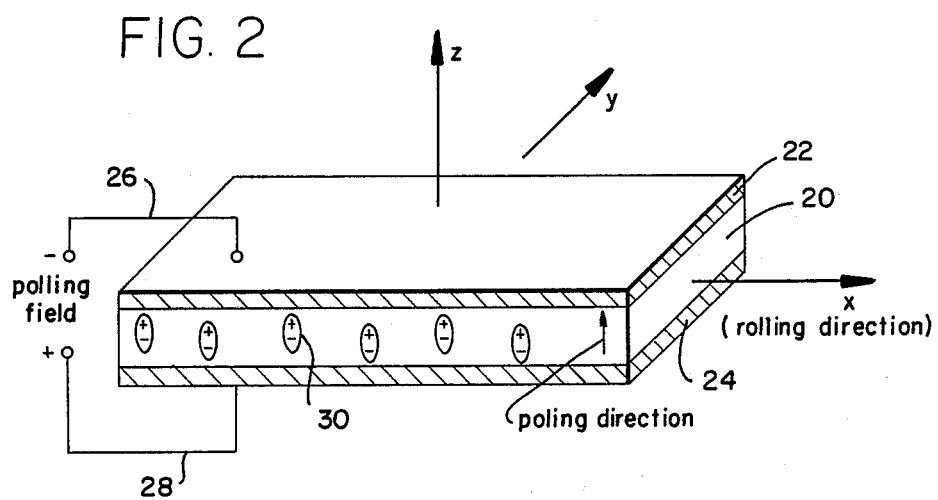
FIG. 2 is a schematic illustration of a polyvinylidene fluoride film used in the embodiments of the invention.

The coordinate axes used for the PVDF film are shown in FIG. 2. Specifically, in FIG. 2 there is illustrated a PVDF film 20, having a pair of surface electrodes 22 and 24 disposed on its top and bottom sides, respectively. A source of potential (not shown) is applied to the electrodes through wires 26 and 28, and this potential acts as a poling field for the PVDF, which generates dipoles in the film as illustrated at 30. The poling axis is always in the z-direction (across the thickness of the film), and the electric field axis is also in the z-direction. For uniaxially stretched film, the x-direction is defined as the stretch, or rolling direction. Thus, the x-axis may be referred as the principal axis of the film.

The mechanical property of an uniaxially stretched PVDF film is thought to be transverse isotropic in the yz plane. However, the mechanical properties of an uniaxially and biaxially stretched PVDF film have been studied extensively, and it was found that even though the coefficients of thermal expansion are anisotropic, Young's modulus for the two types of material have the same value and are isotropic within an experimental error. Therefore, one can model the mechanical property of PVDF as an isotropic material. In other words, the elastic stiffness matrix $c_{pq}^E$ and compliance matrix $s_{pq}^E$ can be explicitly written as:

$$c_{pq}^E = \begin{bmatrix} \lambda + 2\mu & \lambda & \lambda & 0 & 0 & 0 \\ \lambda & \lambda + 2\mu & \lambda & 0 & 0 & 0 \\ \lambda & \lambda & \lambda + 2\mu & 0 & 0 & 0 \\ 0 & 0 & 0 & \mu & 0 & 0 \\ 0 & 0 & 0 & 0 & \mu & 0 \\ 0 & 0 & 0 & 0 & 0 & \mu \end{bmatrix} \quad (5)$$

$$s_{pq}^E = \begin{bmatrix} 1/Y & -\nu/Y & -\nu/Y & 0 & 0 & 0 \\ -\nu/Y & 1/Y & -\nu/Y & 0 & 0 & 0 \\ -\nu/Y & -\nu/Y & 1/Y & 0 & 0 & 0 \\ 0 & 0 & 0 & 2(1+\nu)/Y & 0 & 0 \\ 0 & 0 & 0 & 0 & 2(1+\nu)/Y & 0 \\ 0 & 0 & 0 & 0 & 0 & 2(1+\nu)/Y \end{bmatrix} \quad (6)$$

where Y is the Young modulus, $\nu$ the Poisson's ratio and $\lambda = \nu Y / [(1+\nu)(1-2\nu)]$, $\mu = Y/[2(1+\nu)]$, are the two Lame constants.

Since PVDF possesses a mm2 symmetry, which means that PVDF has the symmetry where the x and y-axes, are the normals of the two mirror planes, and the z-axis is an axis possessing two-fold symmetry, the piezoelectric matrix written for the d constants is:

$$d_{ip} = \begin{bmatrix} 0 & 0 & 0 & 0 & d_{15} & 0 \\ 0 & 0 & 0 & d_{24} & 0 & 0 \\ d_{31} & d_{32} & d_{33} & 0 & 0 & 0 \end{bmatrix}, \quad (7)$$

where $d_{15} = d_{24}$ for PVDF film poled without stretching. However, due to the thin film shape of PVDF, the constants $d_{15}$ and $d_{24}$ remain unknown. Equation (7) reveals that by applying an electric field along the z-axis, only the normal strain will be induced. This explains why all previous applications of PVDF bimorph are primary in a bending mode. In order to detect or actuate both bending and torsional modes, the present invention makes use of a new composite theory.

The mm2 symmetry also reveals that the dielectric permitivity matrix can be written as:

$$\epsilon_{ik}^T = \begin{bmatrix} \epsilon_{11} & 0 & 0 \\ 0 & \epsilon_{22} & 0 \\ 0 & 0 & \epsilon_{33} \end{bmatrix}, \quad (8)$$

Also it should be noted that the pyroelectric constant of PVDF can be permanently decreased by changing the annealing temperature. This offers a way of increasing the thermal stability of PVDF.

As was pointed out earlier, a formal theory needed to be developed for detecting or actuating the bending and/or the torsional modes of a plate. PVDF cannot generate or detect shear strain by applying or detecting electric fields along the z-direction. However, from Mohr's circle it is known that by rotating the plane of observation, the shear strain and normal strain will interchange according to the tensor transformation law. Thus, the apparent restriction of PVDF application can be by-passed by rotating the material axis of PVDF versus the principal axis of existing structures with respect to the z-axis. In addition, other piezoelectric material can be used as a lamina to form a composite structure which is suitable for particular applications. This concept is illustrated in FIG. 3.

Figure 3:
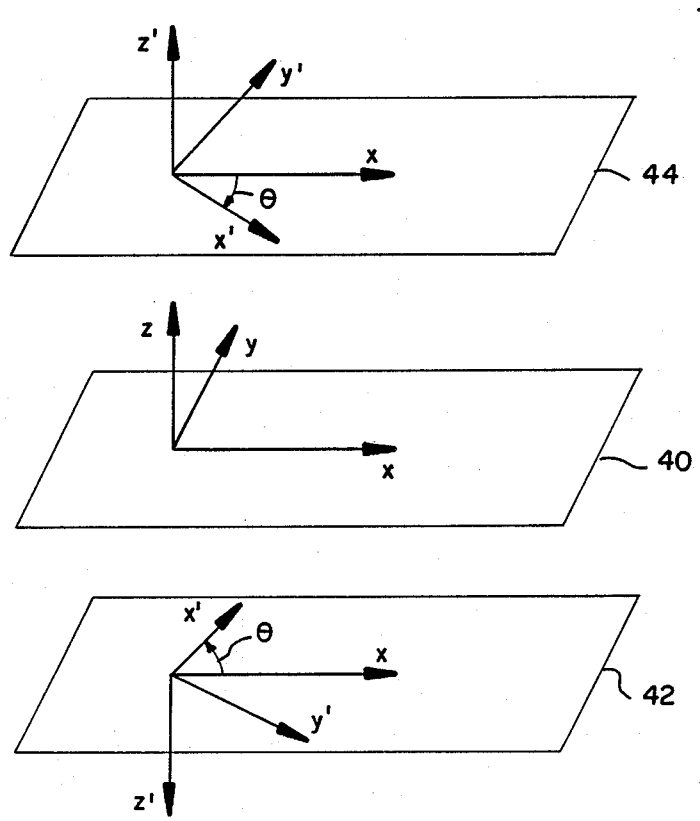
FIG. 3 is a schematic illustration of the coordinate axes of the laminae that form a piezoelectric laminate.

Specifically, in FIG. 3, there is illustrated a possible configuration for a piezoelectric composite. A middle lamina, 40, which can be an existing structure to which additional laminae are to be attached, is shown having the x axis as its principal axis. A second lamina 42 is shown for attachment to the bottom side of lamina 40, and as can be seen, lamina 42 has its principal axis, x'; rotated counterclockwise by a skew angle $\theta$ from the x axis. Similarly, a third lamina 44 is shown for attachment to the top side of lamina 40, and has its principal axis x' rotated clockwise by a skew angle $\theta$ from the x axis. The poling direction as indicated by the arrows along the z axis is positive for lamina 40 and 44, and negative for lamina 42. It should be noted that the poling direction and skew angles for each of the laminae in FIG. 3 are for illustration purposes only, and clearly can be varied depending on the design requirements of the laminate. Also, additional laminae could be added either on top of lamina 44, or below lamina 42 if desired.

Due to the geometry of a beam or plate, such as beam 10 shown in FIG. 1, the magnitudes that $T_3$ can assume are several orders of magnitude less than the values of $T_1$ and $T_2$ which are induced by the bending. Also, the assumption is made that any line perpendicular to the beam or plate midplane before deformation remains perpendicular to the midplane after deformation and it suffers neither extension nor contraction. As a result, the shear stresses, $T_4$ and $T_5$, can be neglected. These assumptions, which are made on the mode of deformation of the beam or plate, are termed the Kirchhoff Hypothesis. For thin plates, the hypothesis results in the existence of a "plane stress state". Thus, one pertinent assumption in establishing the constitutive relationships for the laminate of a laminated structure is that the lamina, when in the composite, is in a plane stress state. This is not to say that the interlaminar shear stresses, $T_4$ and $T_5$, will not be present between laminae once they are placed in the composite. $T_4$ and $T_5$ can be determined from equilibrium considerations:

$$\partial T_4/\partial z = -[\partial T_6/\partial x + \partial T_2/\partial y] \text{ and}$$
$$\partial T_5/\partial z = -[\partial T_1/\partial x + \partial T_6/\partial y].$$

Expanding the Kirchhoff Hypothesis into the piezoelectric composites will give the constitutive relationship of each lamina.

For piezoelectric laminae such as PVDF, Eqs. (3) and (4) can be rewritten based on the plane stress state as follows:

$$\begin{bmatrix} S_{1'} \\ S_{2'} \\ S_{6'} \end{bmatrix} = \begin{bmatrix} 1/Y & -\nu/Y & 0 \\ -\nu/Y & 1/Y & 0 \\ 0 & 0 & 2(1+\nu)/Y \end{bmatrix} \begin{bmatrix} T_{1'} \\ T_{2'} \\ T_{6'} \end{bmatrix} + \begin{bmatrix} d_{3'1'}E_{3'} \\ d_{3'2'}E_{3'} \\ 0 \end{bmatrix}, \quad (9)$$

$$D_{3'} = \epsilon_{3'3'}E_{3'} + d_{3'1'}T_{1'} + d_{3'2'}T_{2'}. \quad (10)$$

Inverting Eq. (9), the plane stress approximation version of Eq. (1) can be obtained:

$$\begin{bmatrix} T_{1'} \\ T_{2'} \\ T_{6'} \end{bmatrix} = \begin{bmatrix} Y/(1-\nu^2) & \nu Y/(1-\nu^2) & 0 \\ \nu Y/(1-\nu^2) & Y/(1-\nu^2) & 0 \\ 0 & 0 & Y/2(1+\nu) \end{bmatrix} \begin{bmatrix} S_{1'} \\ S_{2'} \\ S_{6'} \end{bmatrix} - \begin{bmatrix} Y/(1-\nu^2) & \nu Y/(1-\nu^2) & 0 \\ \nu Y/(1-\nu^2) & Y/(1-\nu^2) & 0 \\ 0 & 0 & Y/2(1+\nu) \end{bmatrix} \begin{bmatrix} E_{3'}d_{3'1'} \\ E_{3'}d_{3'2'} \\ 0 \end{bmatrix}. \quad (11)$$

Equations (10) and (11) are the two constitutive equations used for mm2 class piezoelectric laminae, with the $x'$, $y'$, and $z'$ axes defined along its crystal axes such as PVDF defined in FIG. 1.

Piezoelectric laminae made from other crystal classes can be derived in a similar way. First of all, it must be recognized that the choice of crystal axes for cutting the lamina is arbitrary. Mathematically, the problem consists of carrying out a transformation of axes, resulting in an entirely different set of values for the elastic and piezoelectric constant. With respect to the new axes, piezoelectric effects can be created that were not present in the original system; conversely, by a suitable choice of axes certain elastic or piezoelectric effects may be eliminated. Generally, once the lamina is cut, the constitutive equation for each lamina can be written with respect to the reference axes $x'$, $y'$, and $z'$ as follows:

$$\begin{bmatrix} T_{1'} \\ T_{2'} \\ T_{6'} \end{bmatrix} = [c] \begin{bmatrix} S_{1'} \\ S_{2'} \\ S_{6'} \end{bmatrix} - [c] \begin{bmatrix} E_{3'}d_{3'1'} \\ E_{3'}d_{3'2'} \\ E_{3'}d_{3'6'} \end{bmatrix}, \quad (12)$$

$$D_{3'} = \epsilon_{3'3'}E_{3'} + d_{3'1'}T_{1'} + d_{3'2'}T_{2'} + d_{3'6'}T_{6'}. \quad (13)$$

where it is assumed that due to the thin plate shape, the plane stress state is applicable here and only $E_{3'}$ will be applied. Also, [c] is the stiffness matrix for the lamina with respect to the $x'$, $y'$, and $z'$ axes.

For isotropic laminae made from isotropic material without piezoelectric effect, the constitutive equation for the plane-stress approximation can be obtained from Eqs. (10) and (11) by dropping out the d constants directly. Similarly, an anisotropic lamina without piezoelectric effect can be specified by dropping out the d constant from Eqs. (12) an (13).

If the lamina principal axes ($x'$, $y'$) are not coincident with the reference axes for the laminate, ($x$, $y$), the constitutive equations for each individual lamina must be transformed to the laminate reference axes in order to determine the laminate constitutive relationship.

Due to the definition of the IEEE notation and the convention of the composite laminate theory, the transformation law has to be modified from the tensor transformation law. The transformation law for stress and strain is:

$$\begin{bmatrix} T_{1'} \\ T_{2'} \\ T_{6'} \end{bmatrix} = [T_{m1}] \begin{bmatrix} T_1 \\ T_2 \\ T_6 \end{bmatrix}, \quad (14)$$

$$\begin{bmatrix} S_{1'} \\ S_{2'} \\ S_{6'} \end{bmatrix} = [T_{m2}] \begin{bmatrix} S_1 \\ S_2 \\ S_6 \end{bmatrix}, \quad (15)$$

$$[T_{m1}(\theta)] = \begin{bmatrix} m^2 & n^2 & 2mn \\ n^2 & m^2 & -2mn \\ -mn & mn & m^2 - n^2 \end{bmatrix}, \quad (16)$$

where $$[T_{m2}(\theta)] = \begin{bmatrix} m^2 & n^2 & mn \\ n^2 & m^2 & -mn \\ -2mn & 2mn & m^2 - n^2 \end{bmatrix}, \quad (17)$$

and $m = \cos\theta$, $n = \sin\theta$, and $\theta$ is the skew angle.

For laminae with piezoelectric effect such as PVDF, the poling direction will effect the orientation of the $z'$-axis. Under the plane-stress state, this problem can be taken care of by the sign convention for $E_3$, and $D_3$, that is used. In other words, the relative direction of the $z$ and $z'$ axes affects only the sign of the applied electric field $E_3$. Therefore, if the skew angle is $\theta$, then the constitutive equation for the laminae with respect to the laminate reference axes can be obtained by combining Eqs. (12) and (14–17):

$$\begin{bmatrix} T_1 \\ T_2 \\ T_6 \end{bmatrix} = [\bar{c}_1] \begin{bmatrix} S_1 \\ S_2 \\ S_6 \end{bmatrix} - E_{3'}[\bar{c}_2] \begin{bmatrix} d_{3'1'} \\ d_{3'2'} \\ d_{3'6'} \end{bmatrix}, \quad (18)$$

where $[\bar{c}_1]$ represents the stiffness matrix of the laminae with respect to the laminate axes. Also, the stiffness matrix of the laminae [c] refers to its own axes that are related to $[\bar{c}_1]$ and $[\bar{c}_2]$ as follows: (1) for mechanically isotropic material, $$[c] = \begin{bmatrix} Y/(1-\nu^2) & \nu Y/(1-\nu^2) & 0 \\ \nu Y/(1-\nu^2) & Y/(1-\nu^2) & 0 \\ 0 & 0 & Y/2(1+\nu) \end{bmatrix}, \quad (19)$$

$$[c_1] = [c], \quad (20)$$

$$[c_2] = [T_{m1}(\theta)]^{-1}[c]. \quad (21)$$

(2) for mechanically anistropic material, $$[c_1] = [T_{m1}(\theta)]^{-1}[c][T_{m2}(\theta)], \quad (22)$$

$$[c_2] = [T_{m1}(\theta)]^{-1}[c]. \quad (23)$$

Note also that $$[T_{m1}(\theta)]^{-1} = [T_{m1}(-\theta)], \quad (24)$$

and $$[T_{m2}(\theta)]^{-1} = [T_{m2}(-\theta)]. \quad (25)$$

If the laminae is made from material with ferroelectric behavior such as PVDF, the strength of the poling field can be changed or reversed by repoling. Therefore, $d_{3'1'}$, $d_{3'2'}$, $d_{3'6'}$ can be varied along the xy plane. In other words, $d_{3'1'} = d_{3'1'}(x',y')$, $d_{3'2'} = d_{3'2'}(x',y')$, and $d_{3'6'} = d_{3'6'}(x',y')$. For calculation purposes, the following three functions represent the polarization profile variations:

$$d_{3'1'} = d^0_{3'1'} P_{1'}(x', y'), \quad (26)$$

$$d_{3'2'} = d^0_{3'2'} P_{2'}(x', y'), \quad (27)$$

$$d_{3'6'} = d^0_{3'6'} P_{6'}(x', y'), \quad (28)$$

where $d_{3'1'}$, $d_{3'2'}$, and $d_{3'6'}$ are constants obtained from specifications or measurements. Generally, the polarization profile variations are different for $d_{3'1'}$, $d_{3'2'}$, and $d_{3'6'}$, that is, $P_{1'} \neq P_{2'} \neq P_{6'}$. However, for PVDF, experimental data shows that $P_{6'} = 0$ and $P_1$, and $P_2$, can be made to be equal. Another thing that should be noted for PVDF is that the chief factors which affect $P_{1'}$ and $P_{2'}$ are the polarizing field, poling temperature, poling time, and stretching ratio, as well as the nature of the original film.

Next, the equations which relate the strain at any point in a laminate undergoing some deformation will be developed in terms of displacement at the geometrical midplane of the laminate ($u_o$, $v_o$) and the displacement in the z-direction (w).

Figure 4:
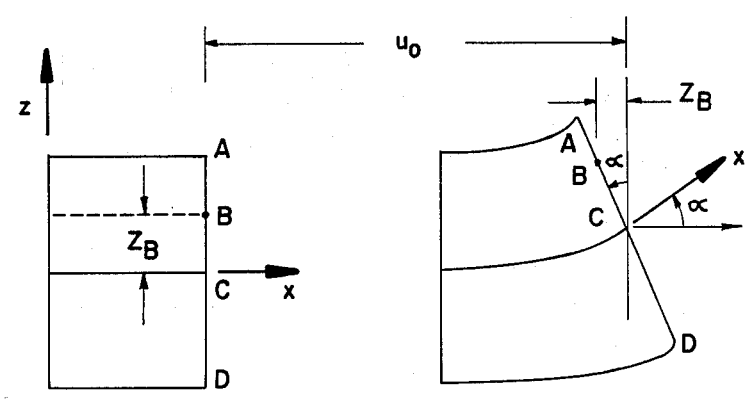
FIG. 4a is a schematic illustration of the cross section of a laminate under no load.
FIG. 4b is a schematic illustration of a cross section of a laminate that has been deformed due to a load.

Consider a section of a laminate in the xz plane, as illustrated in FIG. 4a, which is deformed due to some loading, and then appears as in FIG. 4b. Based on the following assumptions: (1) point C at the geometric midplane undergoes some displacement $u_o$ in the x-direction; and, (2) the line normal to the geometric midplane, ABD, remains straight and normal to the geometric midplane, the displacement of any point on the normal ABD, say of point B, in the x-direction is given by the linear relationship:

$$u_B = u_o - z_B \alpha \quad (29)$$

where $u_o$ is the midplane displacement in the x-direction, $z_B$ is the z coordinate of point B measured from the geometric midplane and $\alpha = \partial w/\partial X$ is the slope of the midplane with respect to the z axis. In other words, the displacement u in the x-direction for an arbitrary point at a distance z from the midplane is $$u = u_o - z \frac{\partial w}{\partial x} \quad (30)$$

Similarly, the displacement in the y-direction for an arbitrary point at a distance z from the geometric midplane is $$v = v_o - z \frac{\partial w}{\partial y} \quad (31)$$

where $v_o$ is the midplane displacement in the y-direction. One thing that should be noted is that Eqs. (30, 31) are the lowest order approximations for laminates which assumes that the displacement of each lamina is the same. Two immediate generalizations that can be seen are: (1) each lamina that has its own displacement and can be related to the displacement of the other laminae by the inter-lamina boundary conditions, can be used for high frequency applications; and, (2) approximating Eq. (29) with a higher order Legendre polynomial can lead to a nonlinear theory.

From linear elasticity, $$S_1 = \frac{\partial u}{\partial x}, \; S_2 = \frac{\partial v}{\partial y}, \text{ and } S_6 = \left[\frac{\partial u}{\partial y} + \frac{\partial v}{\partial x}\right]. \quad (32)$$

Substituting Eqs. (30) and (31) into Eq. (32) yields:

$$\begin{bmatrix} S_1 \\ S_2 \\ S_6 \end{bmatrix} = \begin{bmatrix} S_1^0 \\ S_2^0 \\ S_6^0 \end{bmatrix} + z \begin{bmatrix} k_1 \\ k_2 \\ k_6 \end{bmatrix}, \quad (33)$$

$$\text{where } S_1^0 = \frac{\partial u_0}{\partial x}, \; S_2^0 = \frac{\partial v_0}{\partial y}, \; S_6^0 = \frac{\partial u_0}{\partial y} + \frac{\partial v_0}{\partial x}, \quad (34)$$

$$\text{and } k_1 = -\frac{\partial^2 w}{\partial x^2}, \; k_2 = -\frac{\partial^2 w}{\partial y^2}, \; k_6 = -2\frac{\partial^2 w}{\partial x \partial y}. \quad (35)$$

It should be noted that $k_1$ and $k_2$ are the curvature of the surface in a plane parallel to the xz and yz plane, respectively. Also, $k_6$ represents the twist of the surface with respect to the xy plane.

In summary, by combining Eqs. (12-28) and Eq. (33), the constitutive relationship for a lamina with a skew angle $\theta$ can be written as follows:

$$\begin{bmatrix} T_1 \\ T_2 \\ T_6 \end{bmatrix} = [c_1] \begin{bmatrix} S_1^0 \\ S_2^0 \\ S_6^0 \end{bmatrix} + z[c_1] \begin{bmatrix} k_1 \\ k_2 \\ k_6 \end{bmatrix} - E_3 [c_2] \begin{bmatrix} d^0_{3'1'} P_1(x,y) \\ d^0_{3'2'} P_2(x,y) \\ d^0_{3'6'} P_6(x,y) \end{bmatrix}, \quad (36)$$

$$D_{3'} = \varepsilon_{3'3'} E_{3'} + d^0_{3'1'} P_{1'}(x',y') T_{1'} + d^0_{3'2'} P_{2'}(x',y') T_{2'} + \quad (37)$$
$$d^0_{3'6'} P_{6'}(x',y') T_{6'}.$$

where $T_{1'}$, $T_{2'}$, and $T_{6'}$ can be calculated by combining Eqs. (14) and (36), and $E_3(x,y)$, $P_1(x,y)$, $P_2(x,y)$ and $P_6(x,y)$ can be calculated by substituting either:

$x = m(x' - x'_o) - n(y' - y'_o)$, and $y = n(x' - x'_o) + m(y' - y'_o)$ (38) for the case that z and z' point to the same direction, or $x=m(x'-x'_o)+n(y'-y'_o)$, and $y=n(x'-x'_o)-m(y'-y'_o)$ (39) for the case that z and z' point to the opposite direction, into $E_{3'}(x',y')$, $P_{1'}(x',y')$, $P_{2'}(x',y')$ and $P_{6'}(x'y')$. The $(x'_o,y'o)$ represents the translation from the origin of the lamina reference axes to the origin of the laminate reference axes. Again, for laminae made from material without piezoelectric effect, the constitutive relationship can be obtained from eq. (36) and (37) by setting $P_1(x,y) \equiv P_2(x,y) \equiv P_6(x,y) \equiv 0$.

Figure 5:
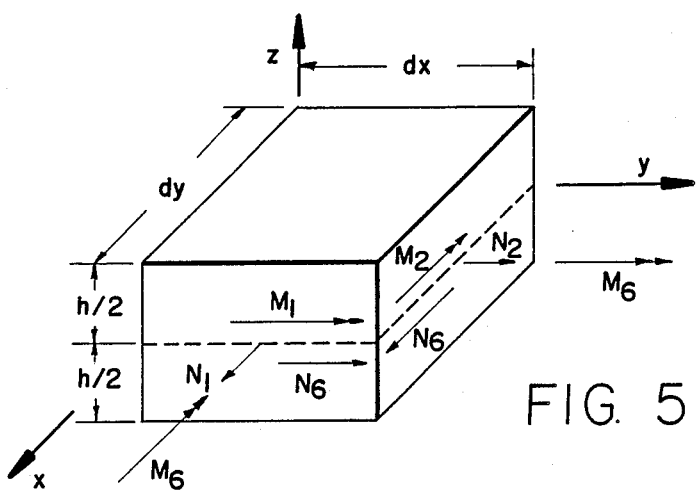
FIG. 5 is a schematic perspective illustration of a laminate showing the stress and moment resultant forces.

Because stress varies from layer to layer in a laminate, and as it is conventional to deal with a simple but equivalent system of forces and moments on a laminate cross-section, definitions are introduced below for stress resultants and moment resultants on an elemental parallelepiped of a laminate as illustrated in FIG. 5. These stress and moment resultants consist of three quantities with the dimensions of force per unit length (the stress resultants) and three quantities with the dimension of length times force per unit length (the moment resultants).

These six quantities together form a system that is quasistatically equivalent to the stress system on the laminate, but which is applied at the geometrical midplane. In terms of these resultants, the total system of loads acting on a cross-section is thus reduced to a system which does not contain the laminate thickness nor the z coordinate explicitly (although, of course, the thickness and the z coordinate enters into the definition of these quantities).

An element parallelepiped cut from a laminate is shown in FIG. 5. The stress results are defined as:

$$N_1 = \int_{-h/2}^{h/2} T_1 \, dz, \tag{40}$$

$$N_2 = \int_{-h/2}^{h/2} T_2 \, dz, \tag{41}$$

$$N_6 = \int_{-h/2}^{h/2} T_6 \, dz. \tag{42}$$

They are the total load acting per unit length at the midplane. the resultant of the stresses is not given entirely by the equivalent total load. In addition, moments must be applied at the midplane which are quasistatically equivalent to the moments created by the stresses with respect to the midplane. These moment resultants are defined as:

$$M_1 = \int_{-h/2}^{h/2} T_1 \, dz, \tag{43}$$

$$M_2 = \int_{-h/2}^{h/2} T_2 \, dz, \tag{44}$$

$$M_6 = \int_{-h/2}^{h/2} T_6 \, dz. \tag{45}$$

With the definition of Eqs. (40–45), a system of three stress resultants and three moment resultants has been found which is quasistatically equivalent to the actual stresses distributed across the thickness of the laminate.

Equations (40–42) and Eqs. (43–45) define a force and moment system acting at the midplane of a laminate in terms of the laminate stresses. Equation (36) defines the stresses acting on any layer or lamina in terms of the midplane strains (which are functions of the midplane displacements), the plate curvatures (which are functions of the deflection w), and the electric field applied. Equations (34–37) define the electric displacement along the thickness direction (z-direction) in terms of the midplane strains, the plate curvatures, and the electric field applied. By combining these equations, relationships between the force and moment system, the midplane strains, the plate curvatures, the electric field applied, and the electric displacement can be obtained. These relationships are the laminate constitutive equations.

The electro-mechanical part of the laminate constitutive equations which use Eq. (36) as a base will now be discussed. Rewriting Eqs. (40–42) in terms of stress vector yields:

$$\begin{bmatrix} N_1 \\ N_2 \\ N_6 \end{bmatrix} = \int_{-h/2}^{h/2} \begin{bmatrix} T_1 \\ T_2 \\ T_6 \end{bmatrix} dz. \tag{46}$$

Figure 6:
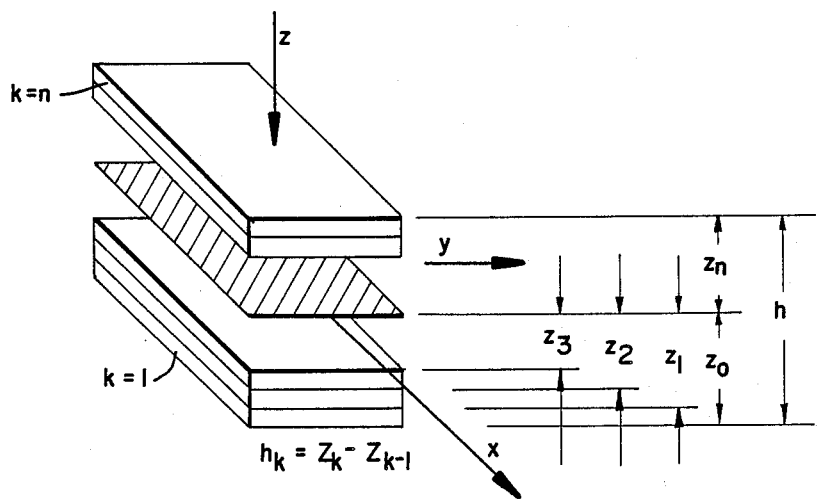
FIG. 6 is a schematic perspective illustration of a laminate showing the notation for the laminae coordinates.

Referring now to FIG. 6, there is illustrated the notation for a lamina coordinate within a laminate. By applying the definitions in Eq. (46) to Eq. (36), separating the continuous integral into an integral area of each of the n-layers, and using the notation of FIG. 6, the stress resultants are expressed as the sum of n simple integrals:

$$\begin{bmatrix} N_1 \\ N_2 \\ N_6 \end{bmatrix} = \sum_{k=1}^{n} \int_{z_{k-1}}^{z_k} \begin{bmatrix} T_1 \\ T_2 \\ T_6 \end{bmatrix}_k dz = \tag{47}$$

$$\sum_{k=1}^{n} \left\{ \int_{z_{k-1}}^{z_k} [c_1]_k \begin{bmatrix} S_1^o \\ S_2^o \\ S_6^o \end{bmatrix} dz + \right.$$

$$\int_{z_{k-1}}^{z_k} [c_1]_k \begin{bmatrix} k_1 \\ k_2 \\ k_6 \end{bmatrix}_k z \, dz -$$

$$\left. \int_{z_{k-1}}^{z_k} (E_3)_k [c_2]_k \begin{bmatrix} d^o_{3'1'} P_1(x,y) \\ d^o_{3'2'} P_2(x,y) \\ d^o_{3'6'} P_6(x,y) \end{bmatrix}_k dz \right\}.$$

Each of these integrals can be easily evaluated since $P_1$, $P_2$, $P_6$, $[S_1^o, S_2^o, S_6^o]^t$ and $[k_1, k_2, k_3]^t$ are not functions of z and within each layer (within $z_{k-1}$ to $z_k$). Also, $E_3$, $[\bar{c}_1]$ and $[\bar{c}_2]$ are not functions of z. Therefore, $$\begin{bmatrix} N_1 \\ N_2 \\ N_6 \end{bmatrix} = \sum_{k=1}^{n} \left\{ [c_1]_k \begin{bmatrix} S_1^o \\ S_2^o \\ S_6^o \end{bmatrix}_k \int_{z_{k-1}}^{z_k} dz - \right. \tag{48}$$

-continued $$[c_1]_k \begin{bmatrix} k_1 \\ k_2 \\ k_6 \end{bmatrix}_k \int_{z_{k-1}}^{z_k} z\, dz + (E_3)_k [c_2]_k \begin{bmatrix} d^o_{3'1'} P_1 \\ d^o_{3'2'} P_2 \\ d^o_{3'6'} P_6 \end{bmatrix} \int_{z_{k-1}}^{z_k} dz \Bigg\}$$

Furthermore, $[S_1^o, S_2^o, S_6^o]^t$ and $[k_1, k_2, k_6]^t$ are not functions of the k-th layer and thus Eq. (48) can be reduced to the following relatively simple form;

$$\begin{bmatrix} N_1 \\ N_2 \\ N_6 \end{bmatrix} = \begin{bmatrix} A_{11} & A_{12} & A_{16} \\ A_{12} & A_{22} & A_{26} \\ A_{16} & A_{26} & A_{66} \end{bmatrix} \begin{bmatrix} S_1^o \\ S_2^o \\ S_6^o \end{bmatrix} + \begin{bmatrix} B_{11} & B_{12} & B_{16} \\ B_{12} & B_{22} & B_{26} \\ B_{16} & B_{26} & B_{66} \end{bmatrix} \begin{bmatrix} k_1 \\ k_2 \\ k_6 \end{bmatrix} - \tag{49}$$

$$\sum_{k=1}^{n} (V_3)_k [c_2]_k \begin{bmatrix} d^o_{3'1'} P_1 \\ d^o_{3'2'} P_2 \\ d^o_{3'6'} P_6 \end{bmatrix}_k ,$$

where $$[A_{ij}] = \sum_{k=1}^{n} [(c_1)_{ij}]_k h_k, \tag{50}$$

$$[B_{ij}] = \tfrac{1}{2} \sum_{k=1}^{n} [(c_1)_{ij}]_k (z_k^2 - z_{k-1}^2), \tag{51}$$

$$(V_3)_k = (E_3)_k h_k, \tag{52}$$

and $h_k = (z_k - z_{k-1})$ is the thickness of the k-th lamina.

The existence of Eq. (52) is due to the fact that each lamina with piezoelectric effect in the configuration shown in FIG. 6 can be treated as a thin dielectric plate. However, $(V_3)_k$ can be varied by changing the surface electrode pattern within each layer. In other words, $$(V_3)_k = \begin{cases} (E_3)_k h_k; & \text{if } (x,y) \text{ covered by electrode,} \\ 0; & \text{if } (x,y) \text{ not covered by electrode.} \end{cases} \tag{53}$$

The $(V_3)_k$ obeys the same sign conventional as $(E_3)_k$.

Equation (49) indicates that for a general piezoelectric laminated plate, the midplane stress resultants are given in terms of the midplane strains, the plate curvatures for small normal curvatures and the voltage applied across each layer. That is, stretching (or compressing), bending and applying an electric field to the laminate induces midplane stress resultants. Furthermore, in the general case, the normal stress resultants $N_1$ and $N_2$ are developed in part by shearing of the midplane, by twisting of the plate, and by the interactions of the electric field and the corresponding piezoelectric constants. The shear stress resultant $N_6$ is developed in part by the normal strains of the midplane, normal bending of the plate, and by the interaction between the electric field and the corresponding piezoelectric constants. In other words, if it is desired to generate shear forces by normal stresses, the laminate can be made anisotropic either mechanically or piezoelectrically.

The moment resultants can be defined in terms of the stress vector, using Eq. (34–36):

$$\begin{bmatrix} M_1 \\ M_2 \\ M_6 \end{bmatrix} = \int_{-h/2}^{h/2} \begin{bmatrix} T_1 \\ T_2 \\ T_6 \end{bmatrix} z\, dz. \tag{54}$$

Substituting Eq. (36) into Eq. (54) and again separating the integration into n sub-intervals:

$$\begin{bmatrix} M_1 \\ M_2 \\ M_6 \end{bmatrix} = \sum_{k=1}^{n} \Bigg\{ \int_{z_{k-1}}^{z_k} [c_1]_k \begin{bmatrix} S_1^o \\ S_2^o \\ S_6^o \end{bmatrix}_k z\, dz + \tag{55}$$

$$\int_{z_{k-1}}^{z_k} [c_1]_k \begin{bmatrix} k_1 \\ k_2 \\ k_6 \end{bmatrix}_k z^2\, dz -$$

$$\int_{z_{k-1}}^{z_k} (E_3)_k [c_2]_k \begin{bmatrix} d^o_{3'1'} P_1(x,y) \\ d^o_{3'2'} P_2(x,y) \\ d^o_{3'6'} P_6(x,y) \end{bmatrix}_k z\, dz \Bigg\}.$$

Following the same procedures used for the stress resultants, the $[\bar{c}_1]_k$, $[\bar{c}_2]_k$ matrices, $(E_3)_k$, $P_1$, $P_2$, $P_3$ can be removed from the integral and $[S_1^o, S_2^o, S_6^o]^t$, $[k_1, k_2, k_6]^t$ can be removed from the summation:

$$\begin{bmatrix} M_1 \\ M_2 \\ M_6 \end{bmatrix} = \Bigg\{ \sum_{k=1}^{n} \int_{z_{k-1}}^{z_k} z\, dz[c_1]_k \Bigg\} \begin{bmatrix} S_1^o \\ S_2^o \\ S_6^o \end{bmatrix} + \tag{56}$$

$$\Bigg\{ \sum_{k=1}^{n} \int_{z_{k-1}}^{z_k} z^2\, dz[c_1]_k \Bigg\} \begin{bmatrix} k_1 \\ k_2 \\ k_6 \end{bmatrix} -$$

$$\Bigg\{ \sum_{k=1}^{n} \int_{z_{k-1}}^{z_k} z\, dz[c_2]_k \begin{bmatrix} d^o_{3'1'} P_1 \\ d^o_{3'2'} P_2 \\ d^o_{3'6'} P_6 \end{bmatrix}_k \Bigg\}.$$

Carrying out the indicated integrations, the constitutive relationship for the moment resultants is obtained as follows:

$$\begin{bmatrix} M_1 \\ M_2 \\ M_6 \end{bmatrix} = \begin{bmatrix} B_{11} & B_{12} & B_{16} \\ B_{12} & B_{22} & B_{26} \\ B_{16} & B_{26} & B_{66} \end{bmatrix} \begin{bmatrix} S_1^o \\ S_2^o \\ S_6^o \end{bmatrix} + \begin{bmatrix} D_{11} & D_{12} & D_{16} \\ D_{12} & D_{22} & D_{26} \\ D_{16} & D_{26} & D_{66} \end{bmatrix} \begin{bmatrix} k_1 \\ k_2 \\ k_6 \end{bmatrix} - \tag{57}$$

$$\sum_{k=1}^{n} z_k^o (V_3)_k [c_2]_k \begin{bmatrix} d^o_{3'1'} P_1 \\ d^o_{3'2'} P_2 \\ d^o_{3'6'} P_3 \end{bmatrix}_k ,$$

where $$[B_{ij}] = \tfrac{1}{2} \sum_{k=1}^{n} [(c_1)_{ij}]_k (z_k^2 - z_{k-1}^2), \tag{58}$$

$$[D_{ij}] = \tfrac{1}{3} \sum_{k=1}^{n} [(c_1)_{ij}](z_k^3 - z_{k-1}^3), \quad (59)$$

$$(V_3)_k = (E_3)_k h_k \quad (60)$$

and $$z_k^o = \tfrac{1}{2}(z_k = z_{k-1}) \quad (61)$$

represents the z-coordinate of the midplane of the k-th layer, i.e. the moment arm of that particular layer.

Equation (57) indicates that for a general piezoelectric laminated plate, the bending moment that arises is given in terms of the midplane strains, the plate curvatures, and the moment arm $z_k^o$ multiplied by the equivalent forces generated by the applied voltage. That is, stretching the midplane, enforcing curvatures, and varying the applied electric field, as well as rearranging the order of the laminae to form the laminated plate, will change the induced bending moment. Furthermore, the normal bending moments $M_1$ and $M_2$ are developed in part due to midplane shearing, plate twisting, and the interaction of the electric field and the corresponding piezoelectric constants. The twisting moment $M_6$ is developed partly due to the midplane normal strains, normal plate curvatures and the interaction of the electric field and the corresponding piezoelectric constants. More specifically, if it is desired to generate torsion by normal stresses, a mechanically or piezoelectrically anisotropic plate can be designed.

The above discussions about stress and moment resultants can be obtained by combining Eqs. (49) and (57) in full for clarity:

$$
\begin{bmatrix} N_1 \\ N_2 \\ N_6 \\ M_1 \\ M_2 \\ M_6 \end{bmatrix} = \begin{bmatrix} A_{11} & A_{12} & A_{16} & B_{11} & B_{12} & B_{16} \\ A_{12} & A_{22} & A_{26} & B_{12} & B_{22} & B_{26} \\ A_{16} & A_{26} & A_{66} & B_{16} & B_{26} & B_{66} \\ B_{11} & B_{12} & B_{16} & D_{11} & D_{12} & D_{16} \\ B_{12} & B_{22} & B_{26} & D_{12} & D_{22} & D_{26} \\ B_{16} & B_{26} & B_{66} & D_{16} & D_{26} & D_{66} \end{bmatrix} \begin{bmatrix} S_1^o \\ S_2^o \\ S_6^o \\ k_1 \\ k_2 \\ k_6 \end{bmatrix} - \quad (62)
$$

$$
\sum_{k=1}^{n} \begin{bmatrix} V_k & 0 & 0 & 0 & 0 & 0 \\ 0 & V_k & 0 & 0 & 0 & 0 \\ 0 & 0 & V_k & 0 & 0 & 0 \\ 0 & 0 & 0 & V_k z_k^o & 0 & 0 \\ 0 & 0 & 0 & 0 & V_k z_k^o & 0 \\ 0 & 0 & 0 & 0 & 0 & V_k z_k^o \end{bmatrix} \begin{bmatrix} [c_2]_k \\ [c_2]_k \end{bmatrix} \begin{bmatrix} d_{3'1'} P_1 \\ d_{3'2'} P_2 \\ d_{3'6'} P_6 \end{bmatrix}_k
$$

The explicit form of $[\bar{c}_2]$ for general material can be obtained by combining Eq. (23) and Eqs. (16, 24).

$$[\bar{c}_2] = [T_{m1}]^{-1} [c] = \quad (63)$$

$$\begin{bmatrix} m^2 & n^2 & -2mn \\ n^2 & m^2 & 2mn \\ mn & -mn & m^2 - n^2 \end{bmatrix} \begin{bmatrix} C_{11} & C_{12} & C_{16} \\ C_{12} & C_{22} & C_{26} \\ C_{16} & C_{26} & C_{66} \end{bmatrix} =$$

$$\begin{bmatrix} (C_2)_{11} & (C_2)_{12} & (C_2)_{16} \\ (C_2)_{21} & (C_2)_{22} & (C_2)_{26} \\ (C_2)_{61} & (C_2)_{62} & (C_2)_{66} \end{bmatrix}.$$

Another thing that should be noted is that for a transversal isotropic or an orthotropic material, $C_{16} = C_{26} = 0$.

Several simplifications can be made for Eq. (62), the governing constitutive equation for laminates, when: (1) [B] is identically zero; and, (2) the "16, 26, 61, 62" terms are zero.

First, simplications can be done in the mechanical part of Eq. (62). The terms in the [B] matrix are obtained as a sum of terms involving the $[\bar{c}_1]$ matrices and the squares of the z-coordinates of the top and bottom of each layer. Since $B_{ij}$ terms are even functions of $z_k$, they are zero for laminates which are symmetrical with respect to z. That is, each term $B_{ij}$ is zero if for each lamina above the midplane, there is an identical lamina (in properties and orientation) located at the same distance below the midplane. Such midplane symmetric laminates are an important class of laminates. They are commonly constructed because the governing constitutive equations are considerably simplified and thus the laminates can be more easily analyzed. In addition, and most importantly, they are desirable because the mechanically bending-stretching coupling present in nonsymmetric laminates causes undesirable warping due to inplane loads, which may be induced by thermal contraction. With midplane symmetric laminates, thermal contractions introduce midplane strains (and inplane loads), but do not introduce bending and twisting.

The possibility of fabricating a laminate where $A_{16} = A_{26} = 0$ will now be examined. It is apparent from Eq. (50) that $A_{ij}$ is equal to the sums of the laminae $(\bar{c}_1)_{ij}$ times the laminae thickness. Thus, the only way an $A_{ij}$ term can be zero is for either all the $(\bar{c}_1)_{ij}$ terms to be zero or to have some $(\bar{c}_1)_{ij}$ positive and some negative. The $(\bar{c}_1)_{ij}$ terms of a lamina are obtained by transforming the $c_{ij}$ terms according to the transformation equation, Eq. (22). Due to the form of the transformation equation (22), $(\bar{c}_1)_{11}, (\bar{c}_1)_{22}, (\bar{c})_{12}$ and $(\bar{c}_1)_{66}$ are always positive and greater than zero. Consequently, $A_{11}, A_{12}, A_{22}$ and $A_{66}$ are always positive and greater than zero. On the other hand, $(\bar{c}_1)_{16}$ and $(\bar{c}_1)_{26}$ are zero for the orientation of 0° and 90° if $c_{16}$ and $c_{26}$ are zero. Also, $(\bar{c}_1)_{16}$ and $(\bar{c}_1)_{26}$ can be either positive or negative since these terms are defined in terms of the odd powers of $\sin\theta$ and $\cos\theta$. In particular, $(\bar{c}_1)_{16}$ and $(\bar{c}_1)_{26}$ for a plus $\theta$ rotation are equal in absolute value but of the opposite sign from the corresponding $(\bar{c}_1)_{16}$ and $(\bar{c}_1)_{26}$ for a negative $\theta$ rotation, respectively. Thus, if for every lamina of a plus $\theta$ orientation, there is another lamina of the same orthotropic properties and thickness with a negative $\theta$ orientation, then the laminate is specially orthotropic with respect to inplane forces and strains ($A_{16} = A_{26} = 0$).

Other "16, 26" terms appear in the [D] matrix. The $D_{ij}$ terms are defined in terms of the $(\bar{c}_1)_{ij}$ and the difference between the third power of the z-coordinate at the top layer and the bottom layer. Since the geometrical contribution $(z_k^3 - z_{k-1}^3)$ is always positive, it follows from the above discussion that $D_{11}, D_{12}, D_{22}$ and $D_{66}$ are always positive. On the other hand, the $D_{16}$ and $D_{26}$ terms are zero if all the laminae are orthotropic in terms of its elastic stiffness matrix and are oriented either at 0° or 90° (since each such layer has $(\bar{c}_1)_{16}=(\bar{c}_1)_{26}=0$). Furthermore, the $D_{16}$ and $D_{26}$ terms are also zero if for every layer oriented at $\theta$ at a given distance above the midplane, there is an identical layer at the same distance below the midplane oriented at $-\theta$ (since $(\bar{c}_1)_{16}(+\theta)=-(\bar{c}_1)_{16}(-\theta)$, $(\bar{c}_1)_{26}(+\theta)=-(\bar{c}_1)_{26}(-\theta)$, and $(z_k^3-z_{k-1}^3)$ is the same for both layers). However, this laminate will then not possess midplane symmetry (then $B_{ij}\neq 0$) unless all the laminae are transverse isotropic in the x'y' plane. However, although the $D_{16}$ and $D_{26}$ terms are not zero for any midplane symmetric laminate except those of crossply cases with skew angle equals to 0° or 90° or transverse isotropic lamina cases, laminates fabricated of a large number of alternating laminae ($+\theta$, $-\theta$ alternated) result in small $D_{16}$ and small $D_{26}$. This is because the contribution of the $+\theta$ layers to the $D_{16}$ and $D_{26}$ terms is opposite in sign to the contribution of the $-\theta$ layers, and as they are located at different distances from the midplane, they tend to have cancelling effects.

Simplifications about the piezoelectric part of Eq. (62) can be observed from Eq. (63). If $d_{3'6'}{}^o$, $(\bar{c}_2)_{16}$, $(\bar{c}_2)_{26}$, $(\bar{c}_2)_{61}$ and $(\bar{c}_2)_{62}$ are zero, then the application of the electric field $E_3$ will only generate normal forces $N_1$, $N_2$ and bending moments $M_1$, $M_2$. Similarly, if $d_{3'1'}{}^o=d_{3'2'}{}^o=0$, $d_{3'6'}{}^o\neq 0$ and $(\bar{c}_2)_{66}\neq 0$, or if $(\bar{c}_2)_{11}P_1d_{3'1'}{}^o+(\bar{c}_2)_{12}P_2d_{3'2'}{}^o+(\bar{c}_2)_{16}P_6d_{3'6'}{}^o=0$, $(\bar{c}_2)_{21}P_1d_{3'1'}{}^o+(\bar{c}_2)_{22}P_2d_{3'2'}{}^o+(\bar{c}_2)_{26}P_6d_{3'6'}{}^o=0$ and $(\bar{c}_2)_{61}P_1d_{3'1'}{}^o+(\bar{c}_2)_{62}P_2d_{3'2'}{}^o=(\bar{c}_2)_{66}P_6d_{3'6'}{}^o\neq 0$, then only shear force $N_6$ and twisting moment $M_6$ will be generated by applying an electric field $E_3$.

The mechano-electrical constitutive equation, Eq. (37), can be used as a starting point to discuss the charge generated across the thickness direction of each individual lamina caused by the displacement of the laminates. The charge can be easily measured through the surface electrode of each lamina. In turn, the electrode pattern will affect the obtained signal.

Since Eq. (37) was evolved from Eq. (2) the dependent variable is the electric displacement D. The primary variables are the strain S and the electric field intensity E. In other words, the stresses $T_{1'}$, $T_{2'}$, $T_{6'}$ in Eq. (37) are stresses calculated from Eq. (36) while the electric field intensity $E_3$ equals zero. More specifically, by starting with the following constitutive relationship:

$$\begin{bmatrix} T_1 \\ T_2 \\ T_6 \end{bmatrix} = [c_1]\begin{bmatrix} S_1^0 \\ S_2^0 \\ S_6^0 \end{bmatrix} + z[c_1]\begin{bmatrix} k_1 \\ k_2 \\ k_6 \end{bmatrix}, \quad (64)$$

and using Eq.s (14, 22, 24) and (64), the following is obtained:

$$\begin{bmatrix} T_{1'} \\ T_{2'} \\ T_{6'} \end{bmatrix} = [\bar{c}_3]\left(\begin{bmatrix} S_1 \\ S_2^0 \\ S_6^0 \end{bmatrix} + z\begin{bmatrix} k_1 \\ k_2 \\ k_6 \end{bmatrix}\right), \quad (65)$$

where $[\bar{c}_3]=[c][T_{m2}]$. (66)

Using Eqs. (38, 39) and (65) to transform Eq. (37) into the reference axes with respect to the laminates, the following equation is obtained:

$$D_3 = A_1(S_1^0 + zk_1) + A_2(S_2^0 + zk_2) + A_6(S_6^0 + zk_6) + \epsilon_{33}^S E_3. \quad (67)$$

where $A_1 = d_{3'1'}^0 \cdot P_1(c_3)_{11} + d_{3'2'}^0 \cdot P_2(c_3)_{21} + d_{3'6'}^0 \cdot P_6(C_3)_{61}$, (68)

$A_2 = d_{3'1'}^0 \cdot P_1(c_3)_{12} + d_{3'2'}^0 \cdot P_2(c_3)_{22} + d_{3'6'}^0 \cdot P_6(c_3)_{62}$, (69)

$A_6 = d_{3'1'}^0 \cdot P_1(c_3)_{16} + d_{3'2'}^0 \cdot P_2(c_2)_{26} + d_{3'6'}^0 \cdot P_6(c_3)_{66}$, (70)

Figure 7:
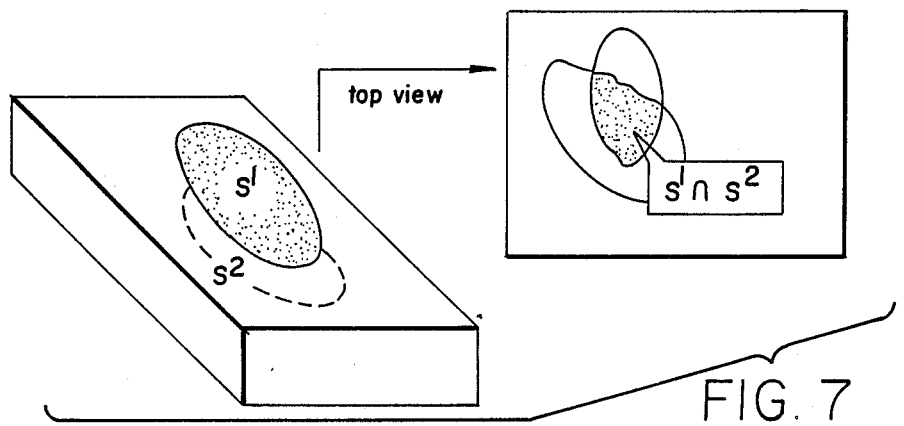
FIG. 7 is a schematic perspective illustration of a piezoelectric lamina having surface electrodes disposed thereon.

From Gauss' law, it is known that the charge enclosed by the surface S can be calculated as:

$$q(t) = \int_S \underline{D} \cdot d\underline{\sigma}, \quad (71)$$

where $\underline{D}$ is the electrical displacement vector, and $d\underline{\sigma}$ is the differential area normal vector of $\overline{S}$. However, if Eq. (71) is used directly to calculate the charge enclosed in a portion of a piezoelectric lamina, the results will be identically zero due to the fact that the charge within a dielectric is neutral. Since charge is built up on the surface of a piezoelectric lamina while it is under the action of an external force field, the equivalent circuit model to relate the closed-circuit charge signal measured from the surface electrode to the force field can be used. The equivalent circuit of a piezoelectric material while it is not resonant in the thickness mode consists of a capacitance in parallel with a resistance across the thickness of the material. The charge built up on the surface due to the mechanical action can be viewed as the charge stored inside the capacitor of the equivalent circuit. For a piezoelectric lamina described above, the electric displacement is $$\underline{D}=D_3\underline{e}_3, \quad (72)$$

where $\underline{e}_3$ is an unit vector parallel to the z-axis. In order for the charge to be measured, the electric loop has to be closed. That is, the electrode has to appear on both sides of the lamina so that a charge moving in the (z)-direction can be measured. More specifically, if the surface electrodes on both sides of the piezoelectric lamina are $S^{(1)}$ and $S^{(2)}$ as shown in FIG. 7, the portion of the electrode which is effective during the measurement can be approximated by the intersection or overlapping portions of $S^{(1)}$ and $S^{(2)}$ as illustrated in the top view of the lamina shown in FIG. 7. Thus, $S^{(12)}=S^{(1)} \cap S^{(2)}$, can be referred to as the effective surface electrode which defines the integration domain where all the points are covered with surface electrode on both sides of the lamina. One thing that should be noted is that the concept of the effective surface electrode is an approximation. From a practical design viewpoint, one must try to minimize the edge effect of the electric field. Based on all these physical arguments, the quantity $q_k$, which represents the charge measured through the electrodes of the k-th layer, can be approximated as follows:

$$q_k(t) = \tfrac{1}{2}\left[\int_{S^{(12)}(z=z_k)} D_3 d\sigma + \int_{S^{(12)}(z=z_{k-1})} D_3 d\sigma\right], \quad (73)$$

where $d\sigma=dxdy$.

Substituting Eq. (67) into Eq. (73) and using the fact that $A_1$, $A_2$, $A_6$, $S_1^o$, $S_2^o$, $S_6^o$, $k_1$, $k_2$, $k_6$ are all independent of z within each lamina, the following equation is obtained $$q_k(t) = \int_{S^{(12)}} A_1(S_1^0 + z_k^0 k_1) + A_2(S_2^0 + z_k^0 k_2) + \qquad (74)$$

$$A_6(S_6^0 + z_k^0 k_6) + \epsilon_{33}^T E_3 \, dxdy,$$

where $z_k^o = (z_k + z_{k-1})/2$ is the same as that defined in Eq. (61). Now replacing $S_1^o$, $S_2^o$, $S_6^o$, $k_1$, $k_2$, $k_6$ in Eq. (74) by Eqs. (34) and (35), the general sensor equation is obtained:

$$q_k(t) = \iint_{S^{(12)}} \qquad (75)$$

$$\left[ A_1 \frac{\partial u_0}{\partial x} + A_2 \frac{\partial v_0}{\partial y} + A_6 \left( \frac{\partial u_0}{\partial y} + \frac{\partial v_0}{\partial x} \right) + \epsilon_{33}^T E_3 \right] dxdy -$$

$$z_k^0 \iint_{S^{(12)}} \left[ A_1 \frac{\partial^2 w}{\partial x^2} + A_2 \frac{\partial^2 w}{\partial y^2} + 2A_6 \frac{\partial^2 w}{\partial x \partial y} \right] dxdy.$$

To relate the charge signal to the mechanical deformation of the structure, $E_3$ has to be set equal to zero. In real experiments, this means connecting the surface electrodes to two sides of a piezoelectric lamina. In other words, the closed-circuit charge signal generated by the k-th piezoelectric lamina is $$q_k(t) = \iint_{S^{(12)}} \qquad (76)$$

$$\left[ A_1 \frac{\partial u_0}{\partial x} + A_2 \frac{\partial v_0}{\partial y} + A_6 \left( \frac{\partial u_0}{\partial y} + \frac{\partial v_0}{\partial x} \right) \right] dxdy -$$

$$z_k^0 \iint_{S^{(12)}} \left[ A_1 \frac{\partial^2 w}{\partial x^2} + A_2 \frac{\partial^2 w}{\partial y^2} + 2A_6 \frac{\partial^2 w}{\partial x \partial y} \right] dxdy.$$

This sensor equation relates the in-plane displacements and the curvature of the plate to the closed-circuit output charge signal. This is the theoretical basis for the later developments of integrated sensors that will be discussed below.

The previous discussion related to the sensor equation, or the equation of the charge generated across the thickness direction of each individual lamina caused by the displacement of the laminates. Now, the reciprocal to the sensor equation, otherwise known as the actuator equation, will be discussed. The actuator equation is the equation of the motion of the laminated plates induced by the applied electric field. The equations of motion for a thin plate are $$\frac{\partial N_1}{\partial x} + \frac{\partial N_6}{\partial y} = \rho h \frac{\partial^2 u_0}{\partial t^2} \qquad (77)$$

$$\frac{\partial N_2}{\partial y} + \frac{\partial N_6}{\partial x} = \rho h \frac{\partial^2 v_0}{\partial t^2} \qquad (78)$$

$$\frac{\partial^2 M_1}{\partial x^2} + 2 \frac{\partial^2 M_6}{\partial x \partial y} + \frac{\partial^2 M_2}{\partial y^2} = \rho h \frac{\partial^2 w}{\partial t^2} - l(x,y,t) \qquad (79)$$

where $N_1$, $N_2$, $N_6$ are the stress resultants, $M_1$, $M_2$, $M_6$ are the moment resultants, $u_o$ and $v_o$ are the midplane displacement along the x and y-directions respectively, w is the displacement in the z-direction, $l(x,y)$ is the distributed transverse loading, h is the total thickness of the laminated plate, and $\rho$ is the equivalent density of laminates defined as:

$$\rho = \sum_{k=1}^{n} \rho_k h_k / h, \qquad (8)$$

with $\rho_k$ representing the density of the k-th lamina, and $h_k$ representing the thickness of the k-th lamina.

As discussed in Eq. (62), the general constitutive equation for a laminate can be written in the form:

$$\begin{bmatrix} N \\ M \end{bmatrix} = \begin{bmatrix} A & B \\ B & D \end{bmatrix} \begin{bmatrix} S^o \\ k \end{bmatrix} - \sum_{k=1}^{n} \begin{bmatrix} V_k & 0 \\ 0 & V_k z_k^o \end{bmatrix} \begin{bmatrix} (c_2)_k \\ (c_2)_k \end{bmatrix} [P_k], \qquad (81)$$

where $[S^o] = [S_1^o, S_2^o, S_6^o]^t$, $[k] = [k_1, k_2, k_6]^t$, $V_k$ is the voltage across the thickness direction of the k-th lamina, i.e. $(V_3)_k$, $[V_k]_{ij} = (V_k)I_{ij}$, $[V_k z_k^o] = (V_k z_k^o)I_{ij}$, $[P_k] = [d_{3'1'}{}^o P_1, d_{3'2'}{}^o P_2, d_{3'6'}{}^o P_6,]^t$, and $I_{ij}$ is the identity matrix.

Substituting Eq. (81) into Eq. (77-79) yields the system of governing differential equations for laminate plates:

$$\left\{ A_{11} \frac{\partial^2 u_o}{\partial x^2} + 2A_{16} \frac{\partial^2 u_o}{\partial x \partial y} + A_{66} \frac{\partial^2 u_o}{\partial y^2} + A_{16} \frac{\partial^2 v_o}{\partial x^2} + \right. \qquad (82)$$

$$(A_{12} + A_{66}) \frac{\partial^2 v_o}{\partial x \partial y} + A_{26} \frac{\partial^2 v_o}{\partial y^2} \left. \right\} - \left\{ B_{11} \frac{\partial^3 w}{\partial x^3} + 3B_{16} \frac{\partial^3 w}{\partial x^2 \partial y} + \right.$$

$$\left. (B_{12} + 2B_{66}) \frac{\partial^3 w}{\partial x \partial y^2} + B_{26} \frac{\partial^3 w}{\partial y^3} \right\} = \rho h \frac{\partial^2 u_o}{\partial t^2} +$$

$$\sum_{k=1}^{n} \frac{\partial}{\partial x} \{ V_k [(c_2)_{11} d_{3'1'}^o P_1 + (c_2)_{12} d_{3'2'}^o P_2 + (c_2)_{16} d_{3'6'}^o P_6] \}_k +$$

$$\sum_{k=1}^{n} \frac{\partial}{\partial y} \{ V_k [(c_2)_{61} d_{3'1'}^o P_1 + (c_2)_{62} d_{3'2'}^o P_2 + (c_2)_{66} d_{3'6'}^o P_6] \}_k,$$

$$\left\{ A_{16} \frac{\partial^2 u_o}{\partial x^2} + (A_{12} + A_{66}) \frac{\partial^2 u_o}{\partial x \partial y} + A_{26} \frac{\partial^2 u_o}{\partial y^2} + A_{66} \frac{\partial^2 v_o}{\partial x^2} + \right. \qquad (83)$$

$$2A_{26} \frac{\partial^2 v_o}{\partial x \partial y} + A_{22} \frac{\partial^2 v_o}{\partial y^2} \left. \right\} - \left\{ B_{16} \frac{\partial^3 w}{\partial x^3} + (B_{12} + \right.$$

$$\left. 2B_{66}) \frac{\partial^3 w}{\partial x^2 \partial y} + 3B_{26} \frac{\partial^3 w}{\partial x \partial y^2} + B_{22} \frac{\partial^3 w}{\partial y^3} \right\} = \rho h \frac{\partial^2 v_o}{\partial t^2} +$$

$$\sum_{k=1}^{n} \frac{\partial}{\partial x} \{ V_k [(c_2)_{61} d_{3'1'}^o P_1 + (c_2)_{62} d_{3'2'}^o P_2 + (c_2)_{66} d_{3'6'}^o P_6] \}_k +$$

$$\sum_{k=1}^{n} \frac{\partial}{\partial y} \{ V_k [(c_2)_{21} d_{3'1'}^o P_1 + (c_2)_{22} d_{3'2'}^o P_2 + (c_2)_{26} d_{3'6'}^o P_6] \}_k,$$

$$\left\{ B_{11} \frac{\partial^3 u_o}{\partial x^3} + 3B_{16} \frac{\partial^3 u_o}{\partial x^2 \partial y} + (B_{12} + 2B_{66}) \frac{\partial^3 u_o}{\partial x \partial y^2} + \right. \qquad (84)$$

$$B_{26} \frac{\partial^3 u_o}{\partial y^3} + B_{16} \frac{\partial^3 v_o}{\partial x^3} + (B_{12} + 2B_{66}) \frac{\partial^3 v_o}{\partial x^2 \partial y} + 3B_{26} \frac{\partial^3 v_o}{\partial x \partial y^2} +$$

$$B_{22}\frac{\partial^3 v_0}{\partial y^3}\bigg\} - \bigg\{ D_{11}\frac{\partial^4 w}{\partial x^4} + 4D_{16}\frac{\partial^4 w}{\partial x^3 \partial y} + 2(D_{12} +$$

$$2D_{66})\frac{\partial^4 w}{\partial x^2 \partial y^2} + 4D_{26}\frac{\partial^4 w}{\partial x \partial y^3} + D_{22}\frac{\partial^4 w}{\partial y^4}\bigg\} - \rho h \frac{\partial^2 w}{\partial t^2} =$$

$$-l(x,y,t) + \sum_{k=1}^{n} \frac{\partial^2}{\partial x^2}\{V_k z_k^0 [(c_2)_{11} d_{3'1'}^0 P_1 + (c_2)_{12} d_{3'2'}^0 P_2 +$$

$$(c_2)_{16} d_{3'6'}^0 P_6]\}_k + \sum_{k=1}^{n} 2\frac{\partial^2}{\partial x \partial y}\{V_k z_k^0 [(c_2)_{61} d_{3'1'}^0 P_1 +$$

$$(c_2)_{62} d_{3'2'}^0 P_2 + (c_2)_{66} d_{3'6'}^0 P_6]\}_k + \sum_{k=1}^{n} \frac{\partial^2}{\partial y^2}\{V_k z_k^0 [(c_2)_{21} d_{3'1'}^0 P_1 +$$

$$(c_2)_{22} d_{3'2'}^0 P_2 + (c_2)_{26} d_{3'6'}^0 P_6]\}_k.$$

The above equations are partial differential equations in terms of three unknown functions $u_o$, $v_o$ and $w$. For the case that $n=1$, Eqs. (82, 83) and Eq. (84) agree with the low-frequency extensional plate equations and the low-frequency flexural plate equations obtained by Tiersten. Since these equations are written in terms of the displacement functions, the compatibility conditions for the thin plate, $$\frac{\partial^2 S_1^o}{\partial y^2} + \frac{\partial^2 S_2^o}{\partial x^2} = \frac{\partial^2 S_6^o}{\partial x \partial y} \quad (85)$$

are automatically satisfied. Therefore, there are three equations to solve three unknowns. In theory, then it is possible to solve for the unknown displacements $u_o$, $v_o$ and $w$ subject to appropriate boundary conditions. Note that the solution in terms $u_o$, $v_o$, and $w$ are known.

Equations (82-84) are called the actuator equations which describe the dynamic behavior of the piezoelectric composite plate under the action of the applied electric field, and the transverse mechanical loading. This is the theoretical basis for the later development of integrated actuators, and are equations of motion for a piezoelectric laminate under the influence of the externally applied electric field and mechanical loading.

Just as the plate constitutive equations in the general cases are simplified considerably by certain limitations, so also are those simplifications when carried over to the governing equations. The first of such simplifications is the consideration of the midplane symmetric laminates described previously. The midplane symmetric laminates do not exhibit coupling between bending and stretching, that is [B]=0. As a direct result, Eqs. (82-84) become the following equations:

$$\bigg\{ A_{11}\frac{\partial^2 u_0}{\partial x^2} + 2A_{16}\frac{\partial^2 u_0}{\partial x \partial y} + A_{66}\frac{\partial^2 u_0}{\partial y^2} + A_{16}\frac{\partial^2 v_0}{\partial x^2} + \quad (86)$$

$$(A_{12} + A_{66})\frac{\partial^2 v_0}{\partial x \partial y} + A_{26}\frac{\partial^2 v_0}{\partial y^2} \bigg\} = \rho h \frac{\partial^2 u_0}{\partial t^2} +$$

$$\sum_{k=1}^{n} \frac{\partial}{\partial x}\{V_k [(c_2)_{11} d_{3'1'}^0 P_1 + (c_2)_{12} d_{3'2'}^0 P_2 + (c_2)_{16} d_{3'6'}^0 P_6]\}_k +$$

$$\sum_{k=1}^{n} \frac{\partial}{\partial y}\{V_k [(c_2)_{61} d_{3'1'}^0 P_1 + (c_2)_{62} d_{3'2'}^0 P_2 + (c_2)_{66} d_{3'6'}^0 P_6]\}_k.$$

$$\bigg\{ A_{16}\frac{\partial^2 u_0}{\partial x^2} + (A_{12} + A_{66})\frac{\partial^2 u_0}{\partial x \partial y} + A_{26}\frac{\partial^2 u_0}{\partial y^2} + A_{66}\frac{\partial^2 v_0}{\partial x^2} + \quad (87)$$

$$2A_{26} + \frac{\partial^2 v_0}{\partial x \partial y} + A_{22}\frac{\partial^2 v_0}{\partial y^2} \bigg\} = \rho h \frac{\partial^2 v_0}{\partial t^2} +$$

$$\sum_{k=1}^{n} \frac{\partial}{\partial x}\{V_k [(c_2)_{61} d_{3'1'}^0 P_1 + (c_2)_{62} d_{3'2'}^0 P_2 + (c_2)_{66} d_{3'6'}^0 P_6]\}_k +$$

$$\sum_{k=1}^{n} \frac{\partial}{\partial y}\{V_k [(c_2)_{21} d_{3'1'}^0 P_1 + (c_2)_{22} d_{3'2'}^0 P_2 + (c_2)_{26} d_{3'6'}^0 P_6]\}_k.$$

$$D_{11}\frac{\partial^4 w}{\partial x^4} + 4D_{16}\frac{\partial^4 w}{\partial x^3 \partial y} + 2(D_{12} + 2D_{66})\frac{\partial^4 w}{\partial x^2 \partial y^2} + \quad (88)$$

$$4D_{26}\frac{\partial^4 w}{\partial x \partial y^3} + D_{22}\frac{\partial^4 w}{\partial y^4} + \rho h \frac{\partial^2 w}{\partial t^2} = l(x,y,t) - \sum_{k=1}^{n} \frac{\partial^2}{\partial x^2}$$

$$\{V_k z_k^0 [(c_2)_{11} d_{3'1'}^0 P_1 + (c_2)_{12} d_{3'2'}^0 P_2 + (c_2)_{16} d_{3'6'}^0 P_6]\}_k -$$

$$2\sum_{k=1}^{n} \frac{\partial^2}{\partial x \partial y}\{V_k z_k^0 [(c_2)_{61} d_{3'1'}^0 P_1 +$$

$$(c_2)_{62} d_{3'2'}^0 P_2 + (c_2)_{66} d_{3'6'}^0 P_6]\}_k -$$

$$\sum_{k=1}^{n} \frac{\partial^2}{\partial y^2}\{V_k z_k^0 [(c_2)_{21} d_{3'1'}^0 P_1 + (c_2)_{22} d_{3'2'}^0 P_2 + (c_2)_{26} d_{3'6'}^0 P_6]\}_k.$$

Equations (86) and (87) with appropriate boundary conditions, govern the in-plane motion of plane stress problem for a midplane symmetric laminated plane. Eq. (88) with appropriate boundary conditions govern the bending and the twisting problem for a midplane symmetric laminate plate. In other words, if a thin plate exerts midplane symmetry, then the in-plane and off-plane dynamic behaviors are governed by the two sets of decoupled equations.

A further simplification is introduced if the in-plane behavior is specially orthotropic mechanically, that is, if $A_{16}=A_{26}=0$. Then the plane stress problem is governed by the equations:

$$\bigg\{ A_{11}\frac{\partial^2 u_0}{\partial x^2} + A_{66}\frac{\partial^2 u_0}{\partial y^2} + (A_{12} + A_{66})\frac{\partial^2 v_0}{\partial x \partial y} \bigg\} = \rho h \frac{\partial^2 u_0}{\partial t^2} + \quad (89)$$

$$\sum_{k=1}^{n} \frac{\partial}{\partial x}\{V_k [(c_2)_{11} d_{3'1'}^0 P_1 + (c_2)_{12} d_{3'2'}^0 P_2 + (c_2)_{16} d_{3'6'}^0 P_6]\}_k +$$

$$\sum_{k=1}^{n} \frac{\partial}{\partial y}\{V_k [(c_2)_{61} d_{3'1'}^0 P_1 + (c_2)_{62} d_{3'2'}^0 P_2 + (c_2)_{66} d_{3'6'}^0 P_6]\}_k.$$

$$\bigg\{ (A_{12} + A_{66})\frac{\partial^2 u_0}{\partial x \partial y} + A_{66}\frac{\partial^2 v_0}{\partial x^2} + A_{22}\frac{\partial^2 v_0}{\partial y^2} \bigg\} = \rho h \frac{\partial^2 v_0}{\partial t^2} + \quad (90)$$

$$\sum_{k=1}^{n} \frac{\partial}{\partial x}\{V_k [(c_2)_{61} d_{3'1'}^0 P_1 + (c_2)_{62} d_{3'2'}^0 P_2 + (c_2)_{66} d_{3'6'}^0 P_6]\}_k +$$

$$\sum_{k=1}^{n} \frac{\partial}{\partial y}\{V_k [(c_2)_{21} d_{3'1'}^0 P_1 + (c_2)_{22} d_{3'2'}^0 P_2 + (c_2)_{26} d_{3'6'}^0 P_6]\}_k.$$

Similarly, if the bending behavior is specially orthotropic mechanically, that is if $D_{16}=D_{26}=0$, then the bending problem is governed by an equation which is essentially of the same form as the bending equation for isotropic plates:

$$D_{11}\frac{\partial^4 w}{\partial x^4} + 2(D_{12} + 2D_{66})\frac{\partial^4 w}{\partial x^2 \partial y^2} + D_{22}\frac{\partial^4 w}{\partial y^4} + \rho h \frac{\partial^2 w}{\partial t^2} = \quad (91)$$

$$l(x,y,t) - \sum_{k=1}^{n}\frac{\partial^2}{\partial x^2}\{V_k z_k^o [(c_2)_{11}d^o_{3'1'}P_1 + (c_2)_{12}d^o_{3'2'}P_2 +$$

$$(c_2)_{16}d^o_{3'6'}P_6]\}_k - 2\sum_{k=1}^{n}\frac{\partial^2}{\partial x \partial y}\{v_k z_k^o [(c_2)_{61}d^o_{3'1'}P_1 +$$

$$(c_2)_{62}d^o_{3'2'}P_2 + (c_2)_{66}d^o_{3'6'}P_6]\}_k - \sum_{k=1}^{n}\frac{\partial^2}{\partial y^2}\{V_k z_k^o [(c_2)_{21}d^o_{3'1'}P_1 +$$

$$(c_2)_{22}d^o_{3'2'}P_2 + (c_2)_{26}d^o_{3'6'}P_6]\}_k.$$

Figure 8:
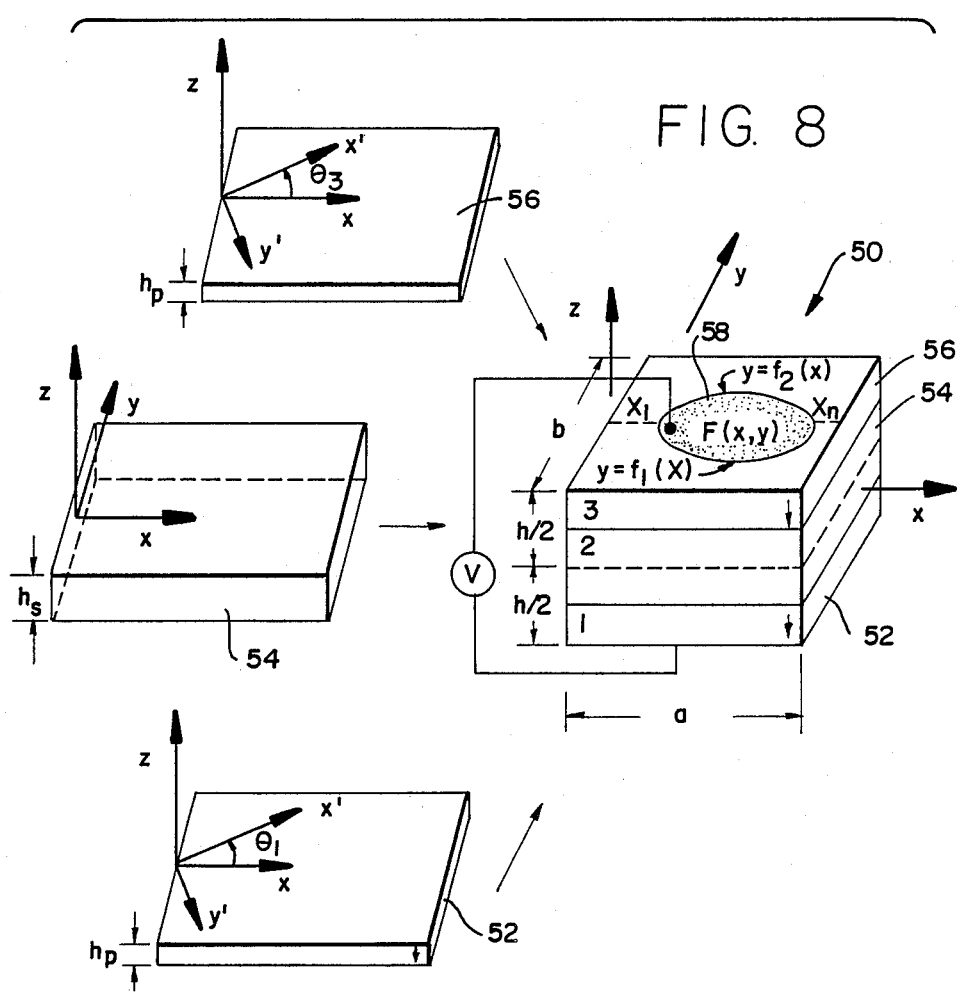
FIGS. 8 and 9 are schematic perspective illustrations of two types of piezoelectric - shim metal laminates showing both exploded and assembled views of the laminates.
Figure 9:
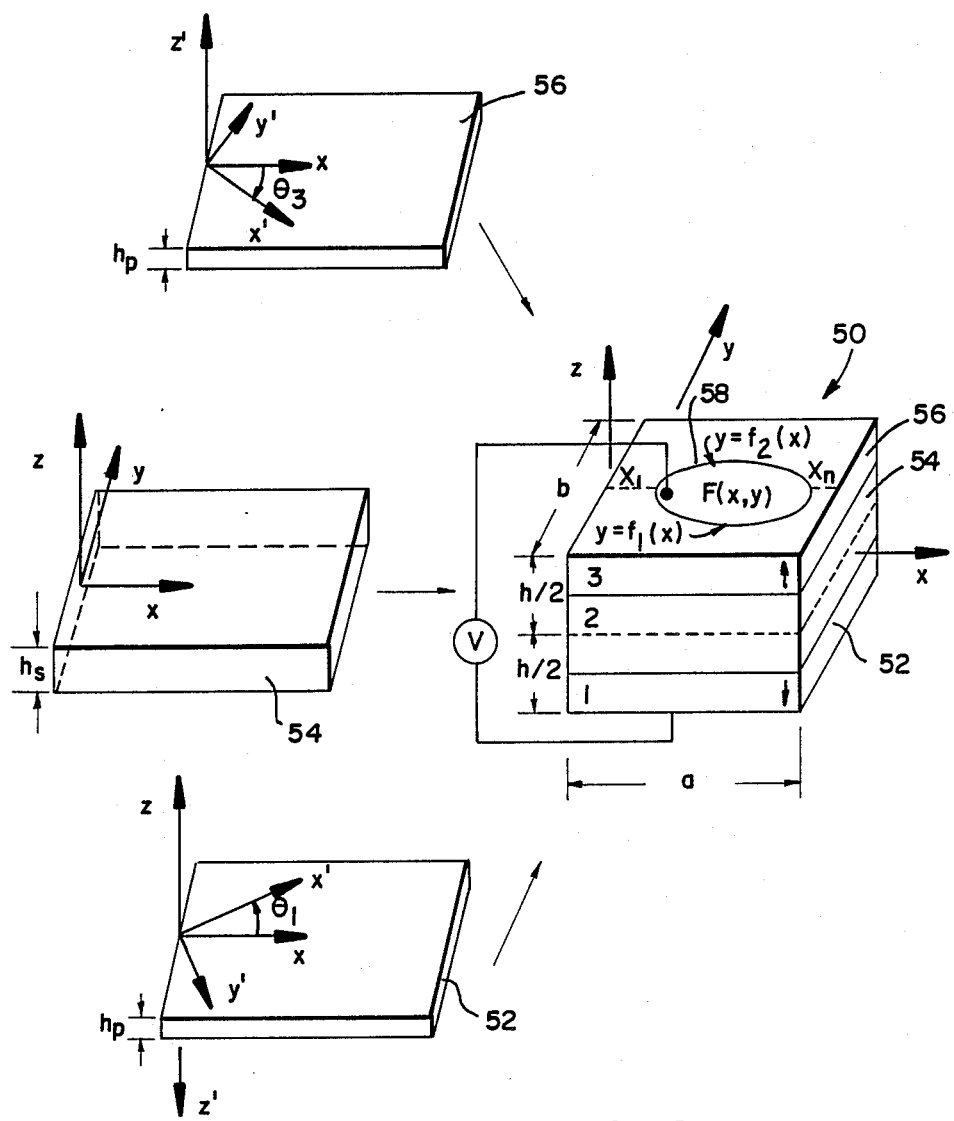

The foregoing theory and analysis relating to piezoelectric composites can be extended specifically to a special type of piezoelectric laminate made of PVDF and isotropic shim metal, such as aluminum, stainless steel, etc. Two of these types of structures are illustrated in FIGS. 8 and 9. Specifically, in FIGS. 8 and 9, there are illustrated three layer PVDF - shim metal composites 50, including: a first or bottom layer of PVDF 52; a second or center layer of shim metal 54 which can be considered as an existing structure; and, a third or top layer of PVDF 56. In FIG. 8, both PVDF layers have their principal axes, x', skewed at angles $\theta_1$ and $\theta_3$ with respect to the reference axis x. In this case, $\theta_1 = \theta_3$, and the laminate will be mechanically transverse isotropic due to the nature of PVDF and shim metal being both mechanically transverse isotropic in the xy plane.

A similar structure is illustrated in FIG. 9, with the only difference being that $\theta_1 = -\theta_3$, and the poling directions for the two PVDF layers are opposite in direction to one another. Again the laminate will be mechanically transverse isotropic for $\theta_1 = \theta_3$. Each of the composites 50 has a length a, a width b, and a thickness h. The thickness of laminae 52 and 56 is $h_p$, while the thickness of shim metal layer 54 is $h_s$. The analysis of these two structures is presented below. First, the actuator equation will be discussed.

Since PVDF and shim metal are mechanically isotropic materials, their stiffness matrix can be obtained from Eqs. (19) and (20) as follows:

$$[c_1]_j = [c]_j = \quad (92)$$

$$\begin{bmatrix} Y/(1-\nu^2) & \nu Y/(1-\nu^2) & 0 \\ \nu Y/(1-\nu^2) & Y/(1-\nu^2) & 0 \\ 0 & 0 & Y/2(1+\nu) \end{bmatrix}_j ; j = p, s,$$

where the subscript p and s represent PVDF and shim metal, respectively. From Eq. (21), $$[c_2]_p = \begin{bmatrix} m^2 & n^2 & -2mn \\ n^2 & m^2 & 2mn \\ mn & -mn & m^2-n^2 \end{bmatrix}\begin{bmatrix} Y/(1-\nu^2) & \nu Y/(1-\nu^2) & 0 \\ \nu Y/(1-\nu^2) & Y/(1-\nu^2) & 0 \\ 0 & 0 & Y/2(1+\nu) \end{bmatrix}_p, \quad (93)$$

where $m = \cos\theta$, $n = \sin\theta$.

Assume that the piezoelectric property of the first and third layer are exactly the same and that the polarization profile variations are equal for $d_{31}$ and $d_{32}$. For both cases, then:

$$d_{3'1'} = d^o_{3'1'}P_o(x,y), \quad (94)$$

$$d_{3'2'} = d^o_{3'2'}P_o(x,y), \quad (95)$$

$$d_{3'6'} = 0. \quad (96)$$

for both layers 1 and 3.

Since the surface electrode of PVDF can be easily reshaped, $(E_3)_k$ can be separated into a spatial and a temporal dependent part:

$$(E_3)_k = \delta_{ep}G(t)F(x,y), \quad (97)$$

where the subscript k represents the k-th layer; $\delta_{ep}$ equals $+1$ if the electric field and poling direction point in the same direction, and $\delta_{ep}$ equals $-1$ if the electric field and poling direction point in the opposite direction. Also, F(x,y) is the function which defines the surface electrode pattern, as illustrated at 58 in FIGS. 8 and 9. In particular, F(x,y)=1, if the point (x,y) is covered by effective surface electrode, and F(x,y)=0, everywhere else on the surface of the PVDF layer. In the particular configurations as shown in FIGS. 8 and 9, only the surface electrodes of the upper surface of PVDF layer 56, and the bottom surface of PVDF layer 52, will be changed. Therefore, the effective surface electrodes pattern is the same pattern observed from the outside surface of the laminate.

For the case in FIG. 8 where $\theta_1 = \theta_3$, the governing equations of the PVDF laminate can be easily obtained. For the applied electric field:

$$(E_3)_1 = -(E_3)_3 = -G(t)F(x,y). \quad (98)$$

Substituting Eqs. (95-98) into the last term of the right hand side (RHS) of Eq. (49) yields $$\begin{bmatrix} N_1 \\ N_2 \\ N_6 \end{bmatrix} = \begin{bmatrix} A_{11} & A_{12} & 0 \\ A_{12} & A_{11} & 0 \\ 0 & 0 & A_{66} \end{bmatrix}\begin{bmatrix} S_1^o \\ S_2^o \\ S_6^o \end{bmatrix} \quad (99)$$

where $[A_{ij}] = [c_1]_s h_s + 2[c_1]_p h_p$. In other words, $$\sum_{k=1}^{3}(V_3)_k [c_2]_k \begin{bmatrix} d^o_{3'1'}P_o \\ d^o_{3'2'}P_o \\ 0 \end{bmatrix} = [0], \text{ and } [B] = [0].$$

Therefore, the applied electric field will not induce in-plane force of the laminated plate. In return, this makes Eqs. (77) and (78) a trivial equation.

Combining Eqs. (59, 92) and [B]=[0], then $D_{16}=D_{26}=0$. Because [B]=[0], only the explicit form of Eq. (91) need be discussed for this particular configuration. From Eq. (59):

$$[D] = \frac{1}{3} \sum_{k=1}^{3} [c_1]_k (z_k^3 - z_{k-1}^3) \quad (100)$$

$$= [c_1]_s \left(\frac{1}{12} h_s^3\right) + [c_1]_p h_p (\tfrac{1}{4} h_s^2 + h_s h_p + \tfrac{4}{3} h_p^2)$$

$$= \begin{bmatrix} D_{11} & D_{12} & 0 \\ D_{12} & D_{11} & 0 \\ 0 & 0 & D_{66} \end{bmatrix},$$

where $$D_{11} = \left(\frac{1}{12} h_s^3\right)[Y/(1-\nu^2)]_s + \quad (101)$$

$$h_p(\tfrac{1}{4} h_s^2 + h_s h_p + \tfrac{4}{3} h_p^2)[Y/(1-\nu^2)]_p,$$

$$D_{12} = \left(\frac{\nu_s}{12} h_s^3\right)[Y/(1-\nu^2)]_s + \quad (102)$$

$$\nu_p h_p(\tfrac{1}{4} h_s^2 + h_s h_p + \tfrac{4}{3} h_p^2)[Y/(1-\nu^2)]_p,$$

$$D_{66} = \left(\frac{1}{12} h_s^3\right)[Y/2(1+\nu)]_s + \quad (103)$$

$$h_p(\tfrac{1}{4} h_s^2 + h_s h_p + \tfrac{4}{3} h_p^2)[Y/2(1+\nu)]_p,$$

and $\nu_p$, $\nu_s$ are Poisson's ratio of PVDF and shim-metal respectively. These terms agree with the results of the classical laminate theory.

From Eq. (57) and Eqs. (78–84), $$\begin{bmatrix} M_1 \\ M_2 \\ M_6 \end{bmatrix} = \quad (104)$$

$$\begin{bmatrix} D_{11} & D_{12} & 0 \\ D_{12} & D_{11} & 0 \\ 0 & 0 & D_{66} \end{bmatrix} \begin{bmatrix} k_1 \\ k_2 \\ k_6 \end{bmatrix} - G(t)F(x,y)P_o(x,y) \begin{bmatrix} R_{31} \\ R_{32} \\ R_{36} \end{bmatrix},$$

where $$R_{31} = [d_{3'1'}^0(m^2 + \nu_p n^2) + \quad (105)$$
$$d_{3'2'}^0(\nu_p m^2 + n^2)][Y_p/(1-\nu_p^2)][h_p(h_p + h_s)],$$

$$R_{32} = [d_{3'1'}^0(\nu_p m^2 + n^2) + \quad (106)$$
$$d_{3'2'}^0(m^2 + \nu_p n^2)][Y_p/(1-\nu_p^2)][h_p(h_p + h_s)],$$

$$R_{36} = mn(d_{3'1'}^0 - d_{3'2'}^0)[Y_p/(1+\nu_p)][h_p(h_p + h_s)], \quad (107)$$

and $m = \cos\theta_1$, $n = \sin\theta_1$. As can be seen in Eq. (104), the first term of the RHS agrees with the result predicted by the classical laminate theory. However, the second term of the RHS, the electric field effect on the piezoelectric laminates, can only be predicted by the newly formulated theory. Applying Eqs. (100, 105–107) and the fact that for this case, $$D_{12} + 2D_{66} = D_{11}, \quad (108)$$

into Eq. (2.4.15), the actuator equation will be obtained for the PVDF composite shown in FIG. 8 when $\theta_1 = \theta_3$:

$$D_{11}\left(\frac{\partial^4 w}{\partial x^4} + 2\frac{\partial^4 w}{\partial x^2 \partial y^2} + \frac{\partial^4 w}{\partial y^4}\right) + \rho h \frac{\partial^2 w}{\partial t^2} = l(x,y,t) - \quad (109)$$

$$G(t)\left\{R_{31}\frac{\partial^2}{\partial x^2}[F(x,y)P_o(x,y)] + 2R_{36}\frac{\partial^2}{\partial x \partial y}[F(x,y)P_o(x,y)] + \right.$$

$$\left. R_{32}\frac{\partial^2}{\partial y^2}[F(x,y)P_o(x,y)]\right\}.$$

This equation has the same form as the equation of motion for the vibration of an isotropic thin plate. This is due to the fact that all the laminae used are transverse isotropic in the xy plane.

One thing that should be noted from Eq. (109) is that the effect of the interactions of the applied electric field and the piezoelectric laminae can be treated as external loadings. That is, $G(t)R_{31}F(x,y)P_o(x,y)$, $G(t)R_{32}F(x,y)P_o(x,y)$, and $G(t)R_{36}F(x,y)P_o(x,y)$ can be viewed as the externally applied $M_1$, $M_2$, and $M_6$ respectively.

Now, for the case illustrated in FIG. 9, where $\theta_1 = -\theta_3$, and knowing that $\cos(-\theta_3) = \cos(\theta_3)$, $\sin(-\theta_3) = -\sin(\theta_3)$, $$(E_3)_1 = (E_3)_3 = -G(t)F(x,y) \quad (110)$$

and from Eqs. (49–52, 78–83) the following is obtained:

$$\begin{bmatrix} N_1 \\ N_2 \\ N_6 \end{bmatrix} = \quad (111)$$

$$\begin{bmatrix} A_{11} & A_{12} & 0 \\ A_{12} & A_{11} & 0 \\ 0 & 0 & A_{66} \end{bmatrix} \begin{bmatrix} S_1^o \\ S_2^o \\ S_6^o \end{bmatrix} + 2G(t)F(x,y)P_o(x,y)\begin{bmatrix} Q_{31} \\ Q_{32} \\ 0 \end{bmatrix},$$

where $$[A_{ij}] = [c_1]_s h_s + 2[c_1]_p h_p, \quad (112)$$

$$Q_{31} = [d_{3'1'}^0(m^2 + \nu_p n^2) + d_{3'2'}^0(\nu_p m^2 + n^2)][Y_p/(1-\nu_p^2)]h_p, \quad (113)$$

$$Q_{32} = [d_{3'1'}^0(\nu_p m^2 + n^2) + d_{3'2'}^0(m^2 + \nu_p n^2)][Y_p/(1-\nu_p^2)]h_p, \quad (114)$$

and $m = \cos\theta_1$, $n = \sin\theta_1$. $\quad (115)$

Also, $$\begin{bmatrix} M_1 \\ M_2 \\ M_6 \end{bmatrix} = \quad (116)$$

$$\begin{bmatrix} D_{11} & D_{12} & 0 \\ D_{12} & D_{11} & 0 \\ 0 & 0 & D_{66} \end{bmatrix}\begin{bmatrix} k_1 \\ k_2 \\ k_6 \end{bmatrix} - G(t)F(x,y)P_o(x,y)\begin{bmatrix} 0 \\ 0 \\ R_{36} \end{bmatrix},$$

The $R_{36}$ in Eq. (116) is the same as that defined in Eq. (107) and can only be predicted by the newly formulated theory. The [D] matrix is the same as that defined in Eq. (100) which matches the result of the classical laminate theory.

Equations (111) and (116) indicate that the applied electric field as shown in FIG. 9 will exert in-plane normal forces $N_1$, $N_2$ and a pure torsion $M_6$ on the piezoelectric composites. In other words, this is a pure twisting actuator in this case.

From Eq. (111) the explicit form of Eqs. (89) and (90) are obtained as follows:

$$A_{11}\frac{\partial^2 u_o}{\partial x^2} + A_{66}\frac{\partial^2 u_o}{\partial y^2} + (A_{12} + A_{66})\frac{\partial^2 v_o}{\partial x \partial y} = \rho h \frac{\partial^2 u_o}{\partial t^2} - \quad (117)$$

$$2G(t)Q_{31}\frac{\partial}{\partial x}[F(x,y)P_o(x,y)],$$

$$(A_{12} + A_{66})\frac{\partial^2 u_o}{\partial x \partial y} + A_{66}\frac{\partial^2 v_o}{\partial x^2} + A_{22}\frac{\partial^2 v_o}{\partial y^2} = \rho h \frac{\partial^2 v_o}{\partial t^2} - \quad (118)$$

$$2G(t)Q_{32}\frac{\partial}{\partial y}[F(x,y)P_o(x,y)].$$

Similarly, the explicit form of Eq. (91) is obtained by combining Eqs. (116, 79) and (81) as follows:

$$D_{11}\left\{\frac{\partial^4 w}{\partial x^4} + 2\frac{\partial^4 w}{\partial x^2 \partial y^2} + \frac{\partial^4 w}{\partial y^4}\right\} + \rho h \frac{\partial^2 w}{\partial t^2} = I(x,y,t) - \quad (119)$$

$$2G(t)R_{36}\frac{\partial^2}{\partial x \partial y}[F(x,y)P_o(x,y)].$$

Again, this equation has the same form as the equation of motion for the vibration of an isotropic thin plate. The effect of the applied electric field appears as an external twisting moment.

Turning now to the sensor equation for the PVDF laminate, the reduction of the general closed-circuit piezoelectric sensor equation, Eq. (76), to the closed-circuit PVDF piezoelectric sensor equation can be obtained by calculating $[c_3]$ first. Combining Eqs. (17, 66,) and (92) yields:

$$[c_3]_k = \begin{bmatrix} Y_p/(1-v_p^2) & v_p Y_p/(1-v_p^2) & 0 \\ v_p Y_p/(1-v_p^2) & Y_p/(1-v_p^2) & 0 \\ 0 & 0 & Y_p/2(1+v_p) \end{bmatrix}_k \begin{bmatrix} m^2 & n^2 & mn \\ n^2 & m^2 & -mn \\ -2mn & 2mn & m^2-n^2 \end{bmatrix}_k, \quad (120)$$

where the subscript k represents the k-th layer, $m = \cos\theta_k$, $n = \sin\theta_k$, and $\theta_k$ is the skew angle for this particular lamina. Substituting Eqs. (94–96) and (120) into Eq. (71) yields:

$$A_1(\theta_k) = \quad (121)$$
$$[d^o_{3'1'}(m^2 + v_p n^2) + d^o_{3'2'}(v_p m^2 + n^2)]_k [P_o Y_p/(1-v_p^2)]_k,$$

$$A_2(\theta_k) = \quad (122)$$
$$[d^o_{3'1'}(v_p m^2 + n^2) + d^o_{3'2'}(m^2 + v_p n^2)]_k [P_o Y_p/(1-v_p^2)]_k,$$

$$A_6(\theta_k) = [mn(d^o_{3'1'} - d^o_{3'2'})(1 + v_p)]_k [P_o Y_p/(1-v_p^2)]_k. \quad (123)$$

Therefore, the explicit form of Eq. (76) in PVDF becomes:

$$q_k(t) = \quad (124)$$

$$\iint_{S^{(12)}}\left[A_1\frac{\partial u_o}{\partial x} + A_2\frac{\partial v_o}{\partial y} + A_6\left[\frac{\partial u_o}{\partial y} + \frac{\partial v_o}{\partial x}\right]\right]_k dx\,dy - z_k^o \iint_{S^{(12)}}\left[A_1\frac{\partial^2 w}{\partial x^2} + A_2\frac{\partial^2 w}{\partial y^2} + 2A_6\frac{\partial^2 w}{\partial x \partial y}\right]_k dx\,dy,$$

where $S^{(12)}$ is the effective surface electrode and $z_k^o = (z_k + z_{k-1})/2$ represents the distance between the center of the k-th lamina and the geometric midplane of the lamina.

By combining several layers of PVDF sensors together, different kinds of dynamic sensors can be generated. Suppose there is another PVDF lamina of the same thickness, say the j-th layer, with skew angle $\theta_j = -\theta_k$ located at $z_j^o = -z_k^o$, then the following relationships can be found:

$$A_1(\theta_j) = A_1(\theta_j) = \overline{A}_1, A_2(\theta_k) = A_2(\theta_j) = \overline{A}_2, A_6(\theta_k) = - A_6(\theta_j) = \overline{A}_6. \quad (125)$$

Combining Eqs. (124) and (125), the following can be obtained:

(1) the pure twisting and shear force sensor:

$$(q_k + q_j)(t) = \quad (126)$$

$$2 \iint_{S^{(12)}}\left[A_1\frac{\partial u_o}{\partial x} + A_2\frac{\partial v_o}{\partial y} - 2A_6 z_k^o \frac{\partial^2 w}{\partial x \partial y}\right]dx\,dy,$$

(2) the pure bending and shear force sensor:

$$(127)$$

$$(q_k - q_j)(t) = 2\iint_{S^{(12)}}\left[A_6\left[\frac{\partial u_o}{\partial x} + \frac{\partial v_o}{\partial y}\right] - z_k^o\left[A_1\frac{\partial^2 w}{\partial x^2} + A_2\frac{\partial^2 w}{\partial y^2}\right]\right]dx\,dy.$$

It should be noted that the physical quantity $(q_k - q_j)$ and $(q_k + q_j)$ can be achieved by wiring the electric output polarity of the two laminae according to Eqs. (126) and (127).

The above sensor equations disclose that sensors which directly reveal the system dynamics without any signal processing efforts can be created by integrating PVDF laminates into existing structures.

From the foregoing theoretical analysis, it is evident that there are a number of design parameters for piezoelectric laminated composites that can be used to control or tailor the response characteristics of the composites. These parameters are: (1) laminating different piezoelectric laminae; (2) changing the skew angles between the structural principal axes and the material axes of each lamina; (3) utilizing the ferroelectric property of PVDF to vary the polarization profile within the plane; and (4) reshaping the surface electrode pattern by means of vacuum deposition, photolithography, screen printing, etc. One thing that should be noted is that the effect of the reshaping of the surface electrode can also be achieved by poling/depoling certain portions of the ferroelectric laminae, or by cutting the piezoelectric laminae to the desired shape.

These four design parameters were used to design a series of experiments to disclose the use of the piezoelectric laminates and to check the validity of the newly formulated theory. The commercially available PVDF thin film with the trade name KYNAR piezo-film manufactured by Pennwalt Corporation is used as the piezoelectric lamina. The PVDF is adhered to the shim metal lamina with conductive adhesive for direct electrical contact between the surface electrodes of the PVDF and the shim metal to which electrical leads have been attached. The surface electrodes used include a 150 Angstrom thick nickel base layer, and a 400 Angstrom thick aluminum cover layer. The PVDF varies in thickness from 6 $\mu$m to 110 $\mu$m, so that the mechanical effects of the surface electrode can be neglected since the PVDF thickness is so much greater than the electrode thickness.

Before a description of the experiments will be set forth, a discussion of the reciprocal relationship between PVDF sensors and actuators will be presented. From the previous analysis, it is known that the PVDF sensor equation, Eq. (124) and the PVDF actuator equations, Eqs. (109, 119), are obtained by integrating the system dynamics into the equations that govern the mechano-electrical and electro-mecahnical interactions of piezoelectric materials. It can be further shown, that if certain layers of the piezoelectric laminae serve as a particular type of actuator, the laminae can also be used as a sensor of the corresponding type, and vice versa. More specifically, if an electric field is applied to a PVDF bending actuator, it will generate a distributed current. However, if instead of applying the electric field to the actuator, the output charge from the same PVDF actuator is measured, the bending angle of the laminate can be measured.

Consider the case shown in FIG. 8, where $\theta_1 = \theta_3$. Recalling the actuator equation and neglecting the transverse mechanical loading, the following is obtained:

$$D_{11}\left\{\frac{\partial^4 w}{\partial x^4} + 2\frac{\partial^4 w}{\partial x^2 \partial y^2} + \frac{\partial^4 w}{\partial y^4}\right\} + \rho h \frac{\partial^2 w}{\partial t^2} = \quad (128)$$

-continued $$-G(t)\left\{R_{31}\frac{\partial^2}{\partial x^2}(FP_o) + R_{32}\frac{\partial^2}{\partial y^2}(FP_o) + 2R_{36}\frac{\partial^2}{\partial x \partial y}(FP_o)\right\},$$

Similarly, since the plate will not have in-plane force, the sensor equation of layers 1 or 3 can be obtained by setting $u_o = v_o = 0$ in Eq. (124):

$$q_k(t) = -z_k^o \iint_{S^{(12)}} A_1 \frac{\partial^2 w}{\partial x^2} + A_2 \frac{\partial^2 w}{\partial y^2} + 2A_6 \frac{\partial^2 w}{\partial x \partial y} dx\, dy. \quad (129)$$

Combining the fact that:

$$e = c^E d \quad (130)$$

and Eqs. (14, 16, 24, 92), the piezoelectric stress/charge constant with respect to the laminate axes (x, y, z) can be calculated as follows:

$$\begin{bmatrix} e_{31}^o \\ e_{32}^o \\ e_{36}^o \end{bmatrix} = \begin{bmatrix} m^2 & n^2 & -2mn \\ n^2 & m^2 & 2mn \\ mn & -mn & m^2-n^2 \end{bmatrix} \begin{bmatrix} Y_p/(1-\nu_p^2) & \nu_p Y_p/(1-\nu_p^2) & 0 \\ \nu_p Y_p/(1-\nu_p^2) & Y_p/(1-\nu_p^2) & 0 \\ 0 & 0 & Y_p/2(1+\nu_p) \end{bmatrix} \begin{bmatrix} d_{3'1'}^o \\ d_{3'2'}^o \\ 0 \end{bmatrix} \quad (131)$$

$$= \frac{Y_p}{1-\nu_p^2} \begin{bmatrix} d_{3'1'}^o(m^2+\nu_p n^2) + d_{3'2'}^o(\nu_p m^2 + n^2) \\ d_{3'1'}^o(\nu_p m^2 + n^2) + d_{3'2'}^o(m^2 + \nu_p n^2) \\ mn(d_{3'1'}^o - d_{3'2'}^o)(1-\nu_p) \end{bmatrix},$$

where $m = \cos\theta$, $n = \sin\theta$ and the superscript "o" means that the quantity is a constant part of the piezoelectric constant. For example, the piezoelectric stress/charge constant $e_{31}$ at a point (x,y) can be calculated by $e_{31}^o$ times the polarization profile $P_o(x,y)$, i.e., $e_{31} = e_{31}^o P_o(s,y)$.

Therefore, $R_{31}$, $R_{32}$, $R_{36}$ and $A_1$, $A_2$, $A_6$ can be rewritten as follows:

$$R_{31} = e_{31}^o h_p(h_p + h_s), \quad R_{32} = e_{32}^o h_p(h_p + h_s), \quad (132)$$
$$R_{36} = e_{36}^o h_p(h_p + h_s), \quad A_1 = e_{31}^o P_o,$$
$$A_2 = e_{32}^o P_o, \text{ and } A_6 = e_{36}^o P_o.$$

Figure 10:
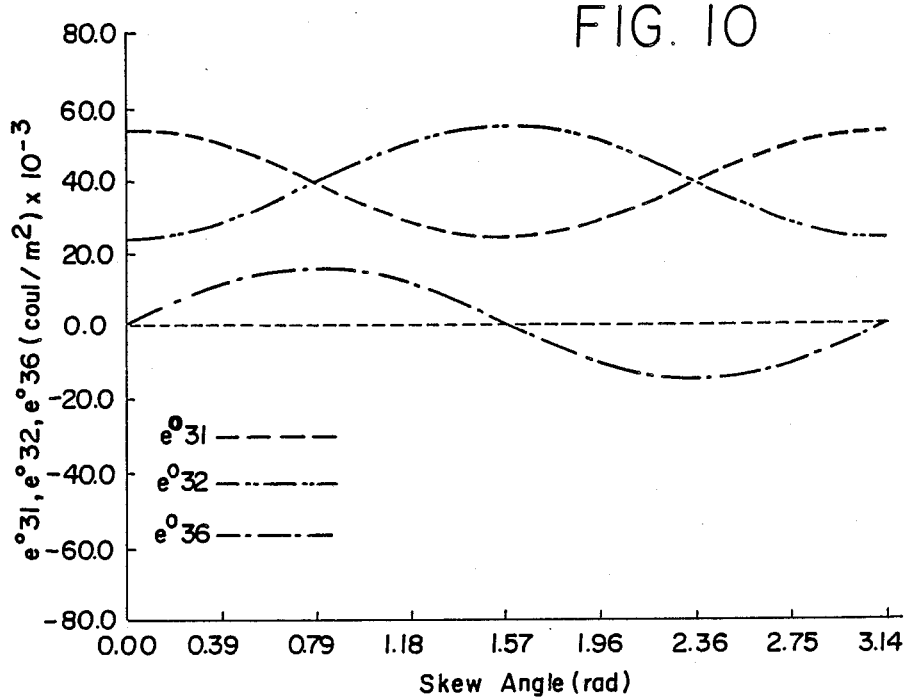
FIG. 10 is a graphical illustration of the values of the piezoelectric stress/charge constants of PVDF as a function of skew angle.

From Eqs. (131, 132) it can be seen that once the material is decided, the skew angle $\theta$ is the parameter which can be used to control the spatial weight factors of moment, force, displacement, etc., along the (1), (2) and (6) directions. For PVDF, the calculated value of $e_{31}^o$, $e_{32}^o$, and $e_{36}^o$ versus the skew angle is plotted in FIG. 10 to reveal the range of the variations.

From the definition of F(x,y) given previously, it is known that $$S^{(12)} = S \cdot F(x, y) \quad (133)$$

Adopting the results of Eqs. (132, 133), Eq. (129) can be rewritten as follows:

$$q_k(t) = -zk^o \int_S F(x,y)P_o(x,y) \left[ e_{31}^o \frac{\partial^2 w}{\partial x^2} + e_{32}^o \frac{\partial^2 w}{\partial y^2} + 2e_{36}^o \frac{\partial^2 w}{\partial x \partial y} \right] d\sigma, \quad (134)$$

where S is the area that is covered by the piezoelectric lamina (with or without electrode), and $d\sigma = dx\, dy$ is the differential area element. Similarly, Eq. (132) can be used to rewrite Eq. (128) as follows:

$$D_{11}\left(\frac{\partial^4 w}{\partial x^4} + 2\frac{\partial^4 w}{\partial x^2 \partial y^2} + \frac{\partial^4 w}{\partial y^4}\right) + \rho h \frac{\partial^2 w}{\partial t^2} = \quad (135)$$

$$-G(t)h_p(h_p + h_s)\left\{ e_{31}^o \frac{\partial^2}{\partial x^2}(FP_o) + e_{32}^o \frac{\partial^2}{\partial y^2}(FP_o) + 2e_{36}^o \frac{\partial^2}{\partial x \partial y}(FP_o) \right\}.$$

From the above it can be seen that a reciprocal relationship exists between the actuator equation and the sensor equation. That is, a distributed moment and its corresponding bending angle are reciprocal. Similarly, the concentrated forces and the corresponding displacements are also reciprocal.

Turning now to the experiments, the first one was conducted on a slender plate, in which the ratio of length versus width is much larger than unity. The displacement of a slender plate can be approximated by:

$$w(x,y,t) = \Phi(x,t) + y\theta(x,t), \quad (136)$$

where $\Phi(x,t)$ and $\theta(x,t)$ are the bending displacement and twisting angle along the longitudinal direction, respectively.

If a PVDF lamina is attached directly to the slender plate, the output charge from the PVDF can be shown to be a direct function of $\Phi(x,t)$, $\theta(x,t)$, and their derivatives. Thus, information about the twisting angle $\theta$, the bending angle $\Phi$, and their derivatives, can be obtained at any point of the structure of the slender plate directly in real time without signal processing requirements.

In the experiment to test this theory, a PVDF thin film having a uniform polarization profile and a spatial uniform electrode pattern, i.e., $FP_o = 1$, was attached to the surface of a slender cantilever plate with a skew angle of 45°. The length and width of the plate was 8 cm and 1 cm, respectively. The experimental set up is illustrated in FIG. 11.

Figure 11:
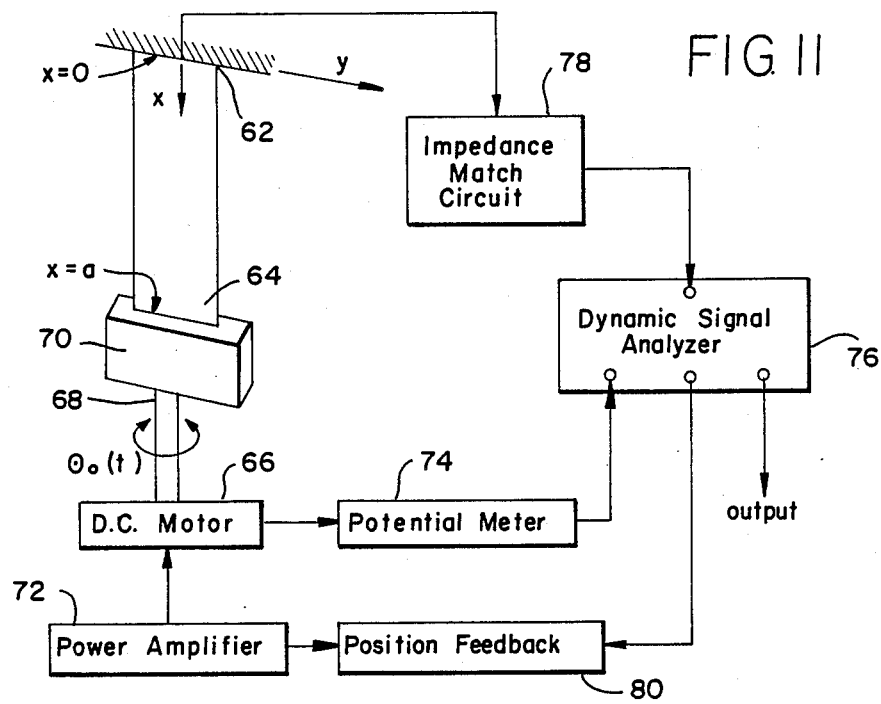
FIG. 11 is a schematic illustration of an experimental set up to test a twisting sensor.

In FIG. 11, there is shown a PVDF and slender plate laminate 60, having a fixed or clamped end 62 at $x=0$, and a hinge clamped end 64 at $x=a$. A DC motor 66 with an output shaft 68 is connected to a clip 70 that is disposed on the hinge clamped end 641. An AC signal is supplied to motor 66 by a power amplifier 72 to generate a twisting motion in laminate 60. By varying the frequency and amplitude of the AC signal sent to motor 66, the twisting frequency and amplitude of the tip displacement can be changed.

The output from motor 66 is monitored by a potential meter 74, and fed to a dynamic signal analyzer 76. Potential meter 74 generates a signal that is related directly to the twisting angle. The charge generated by the PVDF lamina as a result of the twisting motion imparted thereto, is fed to an impedance matching circuit 78, which obtains an open circuit voltage signal from the PVDF, and feeds it to signal analyzer 76, where it is compared to the potential meter output for verification purposes. A position feedback circuit 80 is disposed between signal analyzer 76 and the input to amplifier 72 to overcome the drift of motor 66.

Since the bending motion of laminate 60 is completely eliminated ($\Phi(x,t)=0$) due to the fact that the laminate is fixed at end 62, and hinged at end 64, the charge generated in the PVDF by motor 66 is solely a function of the twisting motion $\theta_o(t)$, and can be expressed as:

$$q_k(t) = -2e_{36}^o zk^o b\theta_o(t). \quad (137)$$

This charge is in direct proportion to the voltage signal generated by the potential meter 74, and thus the validity of Eq. (137) can be determined from this experiment.

In the experiment, the internal signal source of signal analyzer 76 is used to generate a sine-wave sweep linearly from 15 Hz to 45 Hz with a sweep rate 6.87 mHz/sec. This sine-wave is then used to drive motor 66 through amplifier 72 and the position feedback circuit 80. The tip displacement signal is measured through potential meter 74 and is fed into signal analyzer 76. The open-circuit voltage signal of PVDF is also fed through the impedance matching circuit 78 into the signal analyzer 76. The magnitude ratio and the phase difference of the PVDF signal versus the potential meter signal is automatically displayed on a screen and then stored in a memory buffer inside the dynamic signal analyzer 76. Then the signal analyzer is used again to measure the transfer function of the matching circuit 78. Finally, the frequency response of the PVDF open-circuit voltage signal versus potential meter signal is obtained using the internal mathematical calculation ability of the dynamic signal analyzer.

Figure 12:
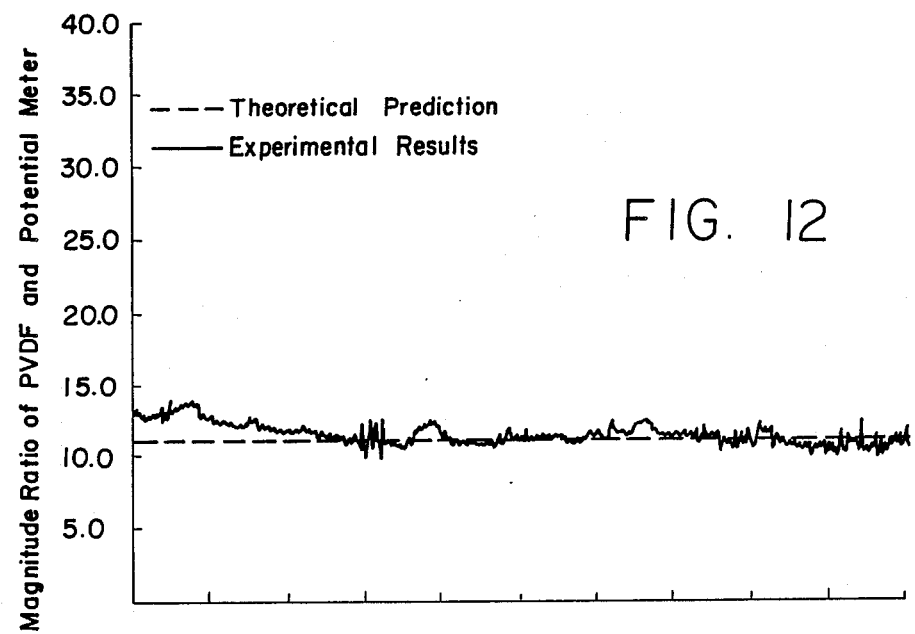
FIG. 12 is a graphical illustration of the twisting sensor test results comparing theoretical predictions and experimental results of the magnitude ratio of the PVDF sensor and a potential meter as a function of input frequency.
Figure 13:
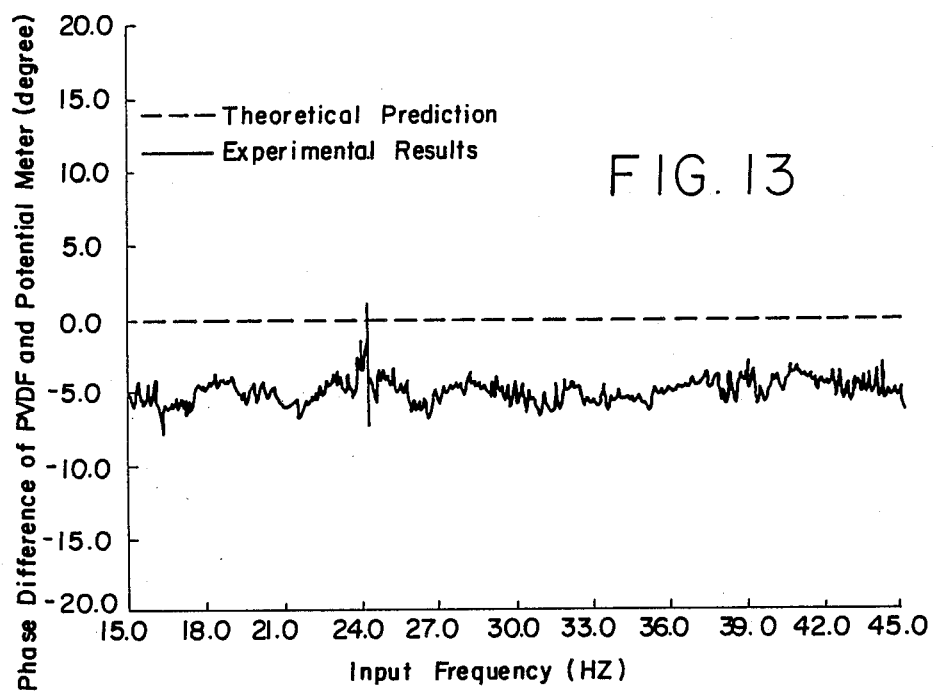
FIG. 13 is a graphical illustration of the twisting sensor test results comparing theoretical predictions and experimental results of the phase difference of the PVDF sensor and the potential meter as a function of input frequency.
Figure 14:
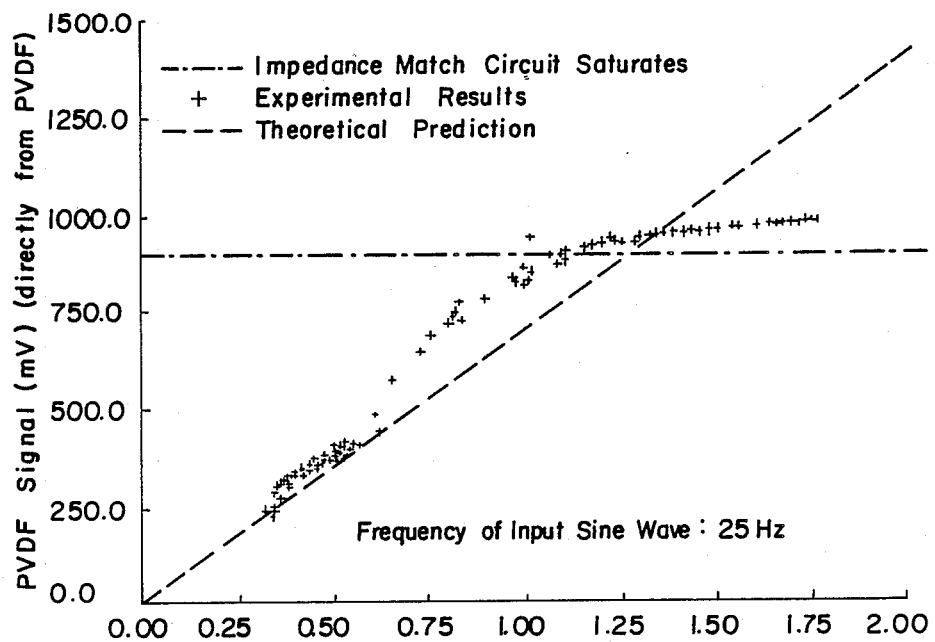
FIG. 14 is a graphical illustration of the twisting sensor test results comparing theoretical predictions and experimental results of the PVDF sensor signal as a function of twist angle.

The results of the experiment are illustrated in FIGS. 12-14. Specifically, in FIGS. 12 and 13, the frequency response of the PVDF is compared to that of potential meter 64. The constant phase lag in FIG. 13 is due to the potential meter since the loss tangent of PVDF is 0.015 at 10Hz to 0.02 at $10^4$ Hz from the specification supplied by the Pennwalt Corporation. Other than this discrepancy, the theoretical predictions and experimental results match closely.

The same holds true for the results illustrated in FIG. 14, which is a graph of the PVDF signal as a function of twist angle at a constant input frequency of 25 Hz. Again, there is a minor discrepancy between the theoretical predictions and the experimental results at around 0.65 to 1.00 degrees, but this can be attributed to the non linearity of the impedance matching circuit.

Several conclusions can be drawn from these data. First, the PVDF sensor is an excellent one due to its flat frequency response across a large bandwidth, its wide linear region of twisting amplitude, and a constant phase lag. For example, a 0.553 degree twist at the tip is enough to induce a 0.405 volt output from the sensor. Third, the data indicates that the theoretical model set forth previously is capable of predicting the response of piezoelectric polymer sensors.

Although the previous experiment was conducted with a single layer of PVDF, it should be understood that multiple layers could be employed as well, and the results could be predicted by the composite piezoelectric theory set forth previously. The key to this experiment was that by skewing the principal axis of the PVDF sensor relative to the principle axis of the slender plate to which it was attached, both bending and torsional motion of the plate could be detected by the sensor. Additional PVDF laminae disposed at various skew angles would provide a composite sensor that could reliably sense any type of complex motion desired.

Turning now to the second experiment which illustrates another embodiment of the present invention, two PVDF sensors were developed that respond only to particular bending modes in the complex motions of a beam, and sense these modes directly without any on-line real time calculation requirements. It has been determined that the electric displacement D, that is generated by a PVDF sensor is directly related to the surface electrode pattern shape. As will be shown by this experiment, by varying the electrode pattern shape, the response characteristics of the sensor will be varied as well. Due to the reciprocal nature of PVDF sensors and actuators, it should be understood that this principal also applies to PVDF actuators.

In one experiment, a pair of PVDF sensors were constructed, one that responds only to bending mode 1, and a second that responds only to bending mode 2. The only difference between the two sensors is in their surface electrode patterns, which can be defined by the function $F(x,y)$ as was done with the PVDF structures illustrated in FIGS. 8 and 9. The manner in which the surface electrode pattern functions are determined to provide a sensor that is responsive only to certain bending modes will now be presented.

The sensor and actuator equation of a single span beam with the same configuration as that shown in FIG. 8 with $\theta_1 = \theta_3 = 0$, can be obtained from Eqs. (134, 135) by setting $w = w(x,t)$. Since it can be assumed there is no moment or force resultants along the y-direction, the summation of $F(x,y)P_o(x,y)$ along the y-direction can be used to represent the spatial dependent part of the interactions between the PVDF and the electrical field. In other words, the following can be defined:

$$\mathscr{F}(x) = \int_{-\frac{b}{2}}^{\frac{b}{2}} F(x,y) \, P_o(x,y) \, dy, \tag{138}$$

where b is the width of the beam. Then, the sensor equation of a single span beam becomes:

$$q_k(t) = -z_k^o \, e_{31}^o \int_0^a \mathscr{F}(x) \frac{\partial^2 w}{\partial x^2} \, dx, \tag{139}$$

where a is the length of the beam and $$e_{31}^o = [d_{31}^o + \nu_p \, d_{32}^o] \, [Y_p/(1 - \nu_p^2)]. \tag{140}$$

Similarly, the actuator equation becomes:

$$EI \frac{\partial^4 w}{\partial x^4} + \rho h \frac{\partial^2 w}{\partial t^2} = -h_p \, (h_p + h_s) \, G(t) \, e_{31}^o \, \frac{d^2 \mathscr{F}(x)}{dx^2}. \tag{141}$$

where the flexural rigidity of the beam EI is another way of writing the term $D_{11}$ used previously.

The transverse deformation of the beam w can be decomposed into the summation of the modal deformation:

$$w(x,t) = \sum_{i=1}^{\infty} A_i(t) \, \phi_i(x), \tag{142}$$

where $A_i(t)$ and $\phi_i(x)$ are the modal coordinate and mode shape function of mode i, respectively. Substituting Eq. (142) into Eq. (139) yields that $$q_k(t) = \sum_{i=1}^{\infty} A_i(t) \, B_i, \tag{143}$$

where $$B_i = -z_k^o \, e_{31}^o \int_0^a \mathscr{F}(x) \, [d^2\phi_i(x)/dx^2] \, dx. \tag{144}$$

Since the beam is a self-adjoint system, the modes are orthogonal to each other. This property can be used to help design a modal sensor/actuator. For an easy explanation, consider a cantilever beam with length a. The mode shapes $\Phi_i(x)$ for the cantilever beam are $$\phi_i(x) = [\cosh(\lambda_i x/a) - \cos(\lambda_i x/a) - \sigma_i[\sinh(\lambda_i x/a) - \sin(\lambda_i x/a)], \tag{145}$$

where the dimensionless natural frequency parameters $\lambda_i$ and $\sigma_i$ can be numerically computed from the following formulas:

$$\cos \lambda \cosh \lambda + 1 = 0 \tag{146}$$

and $\sigma_i = (\sinh \lambda_i - \sin \lambda_i)/(\cosh_i + \cos \lambda_i)$ (147)

For the cantilever beam, this gives $\lambda_1 = 1.87510407$, $\lambda_2 = 4.6940911$, etc., and $\sigma_1 = 0.734095514$, $\sigma_2 = 1.018467319$, etc.

Combining Eq. (144) and the fact that $$\int_0^a [d^2\phi_n(x)/dx^2] \, [d^2\phi_j/dx^2] \, dx = \delta_{nj} \, [\lambda_n^4/a^3], \tag{148}$$

where $\delta_{ij}$ is the Kronecker delta, if $\mathscr{F}(x)$ is chosen equal to a scale constant $\mu_n$ times the second derivative of a particular mode shape, a modal sensor will be created.

In other words, if $$\mathscr{F}(x) = \mu_n \, [d^2\phi_n(x)/dx^2], \tag{149}$$

Eq. (144) becomes $$B_i = -z_k^o e_{31}^o \mu_n \, [\lambda_n^4/a^3] \, \delta_{ni}. \tag{150}$$

Therefore, Eq. (143) reduces to the modal sensor equation as follows:

$$q_k(t) = -[z_k^o e_{31}^o \mu_n \lambda_n^4/a^3] \, A_n(t). \tag{151}$$

This equation allows a particular modal coordinate to be measured directly.

A couple points need to be addressed before Eq. (151) can be turned into a real physical system. First, if the polarization profile, $P_o$, is chosen to be uniform and in one direction, $\mathscr{F}(x)$ can be achieved by varying the surface electrode pattern F(x,y) according to equation (138). Second, simply varying the surface electrode pattern cannot generate a negative value for $\mathscr{F}(x)$ which is required for part of $d^2\Phi_n(x)/dx^2$ for modes greater than 1. Thus, for example, a mode 2 sensor cannot be created only by varying the surface electrode pattern. This problem leads to yet another aspect of the present invention, wherein the polarization profile, $P_o$, is varied to obtain a sensor that is responsive to a particular motion.

Figure 15A:
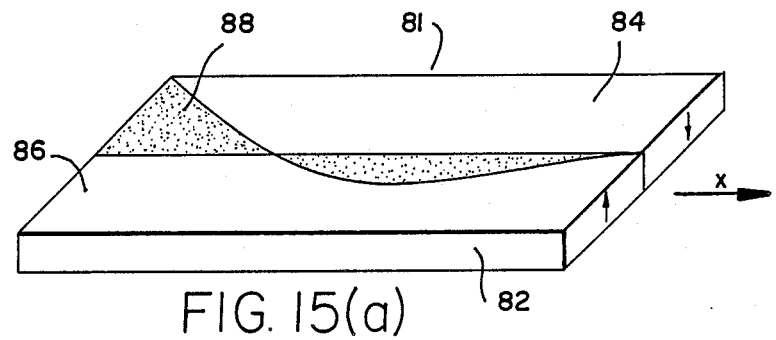
FIGS. 15a–c are three schematic perspective illustrations of different configurations of PVDF modal sensors for sensing bending mode 2.
Figure 15B:
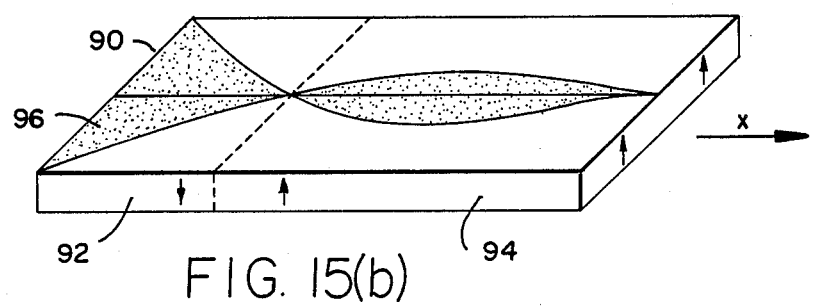
Figure 15C:
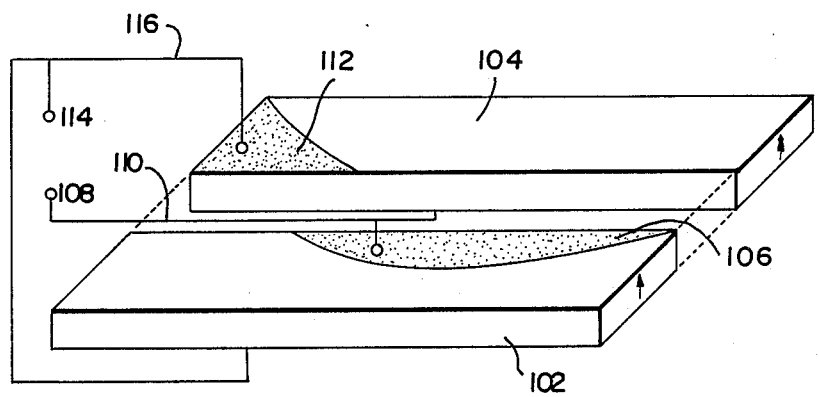

Referring to FIGS. 15a-c, there are shown three different sensors for directly sensing mode 2. In FIG. 15a, there is shown a sensor/actuator 81 having a PVDF film layer 82 formed of two longitudinal sections 84 and 86. A surface electrode 88 is disposed on the top side of film layer 82, and is shaped in accordance with Eq. (151) to obtain a mode 2 sensor. However, since a negative value of $\mathscr{F}(x)$ is required to satisfy the mode 2 equation, section 86 has been poled in a direction opposite to that of section 84. Thus, due to the oppposition of the poling directions of sections 84 and 86, the positive and negative portions of $\mathscr{F}(x)$ can both be achieved.

Similarly, in FIG. 15b, a sensor/actuator 90 is divided along its y axis into two sections 92 and 94, with section 92 being negatively poled, and section 94 being positively poled. A mode 2 surface electrode pattern 96 is disposed on the top surfaces of sections 92 and 94 as shown. Again, the result is the same since charge generated in sections 92 and 94 will be of opposite sign while the sensor 90 is under the effect of stress or strain.

Finally, FIG. 15c illustrates yet another alternative wherein, as in FIG. 15a, a sensor 100 is longitudinally split into two sections 102 and 104. In this case, however, both halves are positively poled. Instead, the output polarity of the two sections are wired opposite from one another, so once again the same result is obtained. Specifically, a top surface electrode 106 of section 102 is connected to an output terminal 108 along with a bottom surface electrode (not shown) of section 104 with a wire 110, while a top surface electrode 112 of section 104 is connected to a second output terminal 114 along with a bottom surface electrode (not shown) of section 102 with a wire 116.

It should be clear that while FIGS. 15a-c illustrate how the polarization profile can be effectively varied to aid in the design of a mode 2 sensor, the polarization profile $P_o$ could be varied in any desired way (not only in direction, but in magnitude as well) to satisfy any desired $\mathscr{F}(x)$ in accordance with Eq. (138) and thereby create a sensor/actuator that will be responsive to one or more specific components of any complex mechanical motion.

Figure 16B:
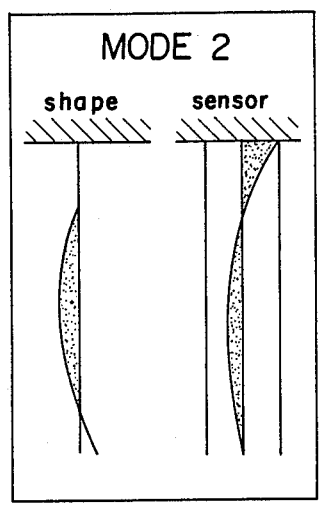
FIGS. 16a and b are graphical illustrations of bending modes 1 and 2, respectively, along with the corresponding sensor electrode pattern shapes.
Figure 16A:
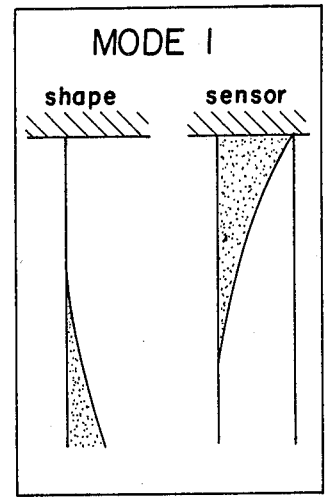

Getting back now to the experiment for testing modal sensors, FIGS. 16a and b illustrate the mode 1 and mode 2 shapes, respectively, along with the corresponding surface electrode patterns for the PVDF sensors.

Figure 17:
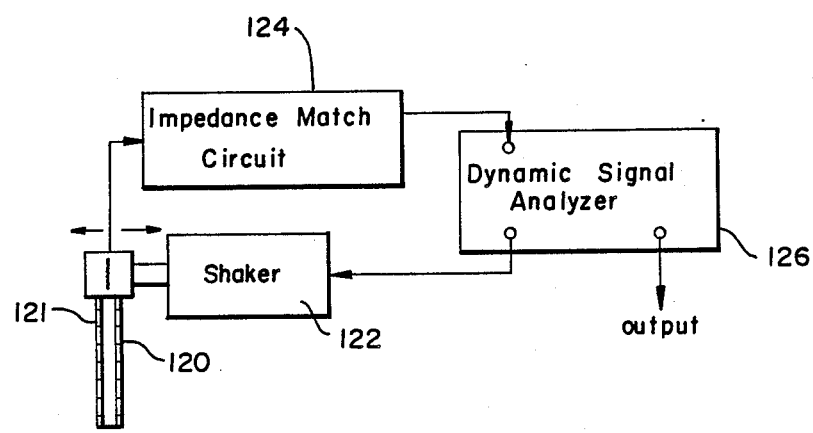
FIG. 17 is a schematic illustration of an experimental set up to test modal sensors.

Turning now to FIG. 17, there is illustrated the experimental set up used to test the modal sensors. A pair of PVDF modal sensors 120 and 121 are shown attached to a shaker mechanism 122 for generating the bending motion in the sensor. As with the prior experiment, the output from sensors 120 and 121 is fed to an impedance matching circuit 124, and then to a dynamic signal analyzer 126. In turn, the signal analyzer provides a signal to shaker 122.

The mode 1 and mode 2 sensors are fabricated by first pasting two pieces of 110 μm thick PVDF on both sides of a 25.4 μm stainless steel shim stock to form a 14.5 cm long, 1.0 cm wide cantilever beam. Then the surface electrode of the PVDF is etched according to Eq. (149) with $\mu_1=1$, and $\mu_2=(a/\lambda_2)^2/2$. Again, the dynamic signal analyzer is used to perform the sweep sine measurement. The sine-wave from 5 Hz to 55 Hz with a sweep rate of 6.87 mHz/sec is used to drive shaker 122 which in turn drives the PVDF modal sensors. The frequency response curves of mode 1 and mode 2 sensors are measured and displayed separately.

Figure 18A:
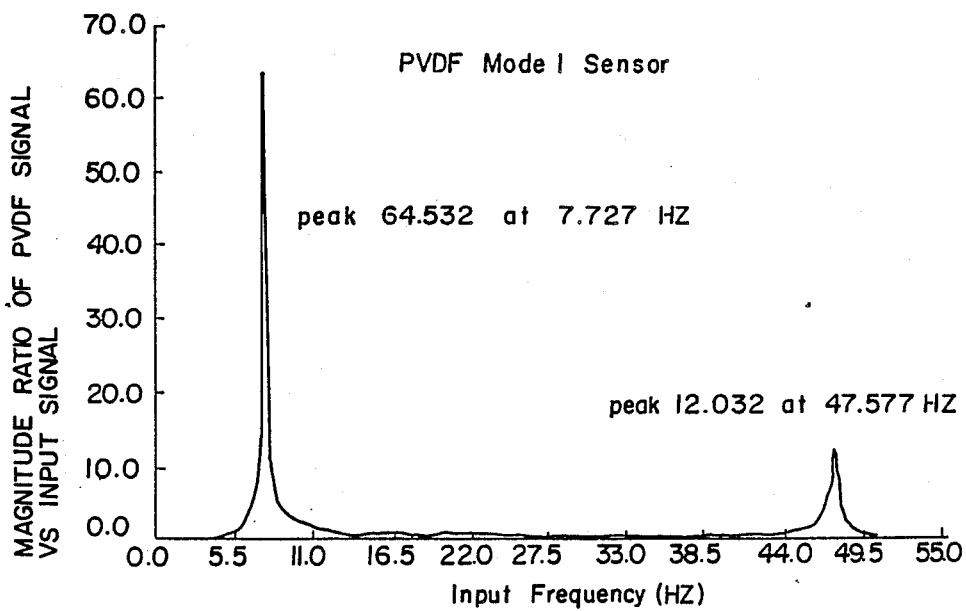
FIGS. 18a and 18b are a graphical illustrations showing the results of the modal test for PVDF mode 1 and 2 sensors with the magnitude ratio of the PVDF signal and source signal being plotted as a function of driving frequency.
Figure 18B:
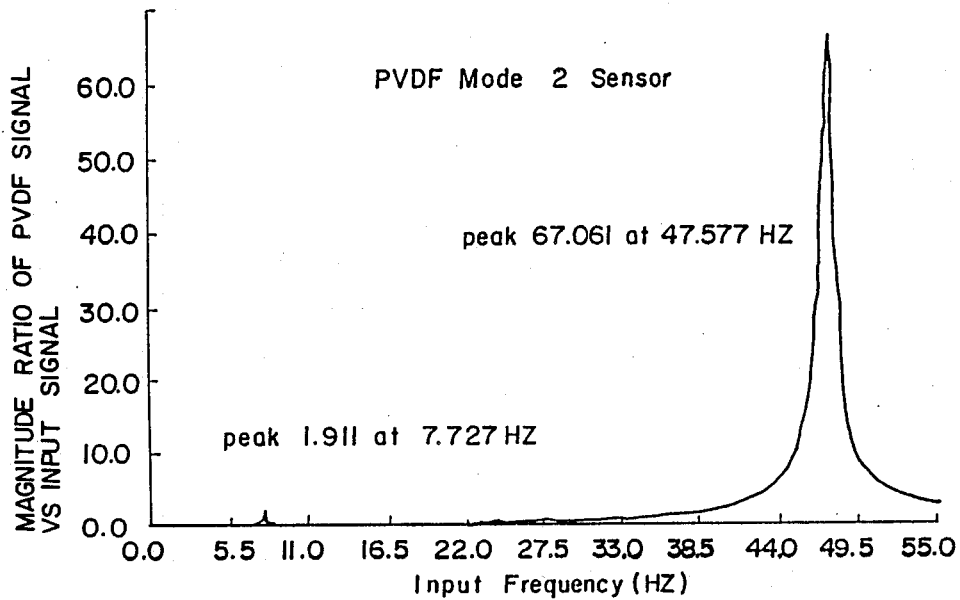

The magnitude ratio of the PVDF signal and source signal from the dynamic signal analyzer versus the driving frequency of the shaker is shown in FIGS. 18A and 18B. The natural frequencies of mode 1 and 2 of this piezoelectric composite are 7.727 Hz and 47.577 Hz, respectively. From FIG. 18 it can be seen that while the beam is resonant in the first mode, the output from the mode 1 sensor is five times larger than that from the mode 2 sensor. Also, while the beam is resonant in the second mode, the mode 2 sensor output is more than thirty times larger than the mode 1 sensor output.

According to the theory developed above, the mode 1 sensor should only respond to the mode 1 coordinate. This is not what is shown in FIG. 18A. The major reason was seen from the observation of the boundary of the surface electrode pattern, which was not smooth enough to be considered a match with the theoretical predictions. However, even with such a rough etching process, the response of the mode 1 sensor is still more than five times larger than the mode 2 sensor response during mode 1 resonant. This effect is even more significant while the system is resonant at the second mode. The responses between the sensors have more than thirty times difference at that frequency. The results from this experiment verify that different types of sensors can be created by changing the surface electrode pattern.

From the above discussion, it has been shown that the combination of a particular electrode pattern and a corresponding polarization profile will create a modal sensor. Therefore, according to the results, either several modal sensors can be directly integrated into one lamina, or a piezoelectric laminate with different modal sensors can be created within different laminae. However, the concept of spatial multiplexation can also be adopted to integrate several modal sensors, which share part of the surface electrode, into one lamina. More specifically, by overlapping the surface electrode pattern needed for the first three modes of a cantilever beam, for example, it can be seen that the surface electrode can be separated into eight segments with the polling direction of segments 1-4 and 5-8 in the opposite directions.

Figure 19:
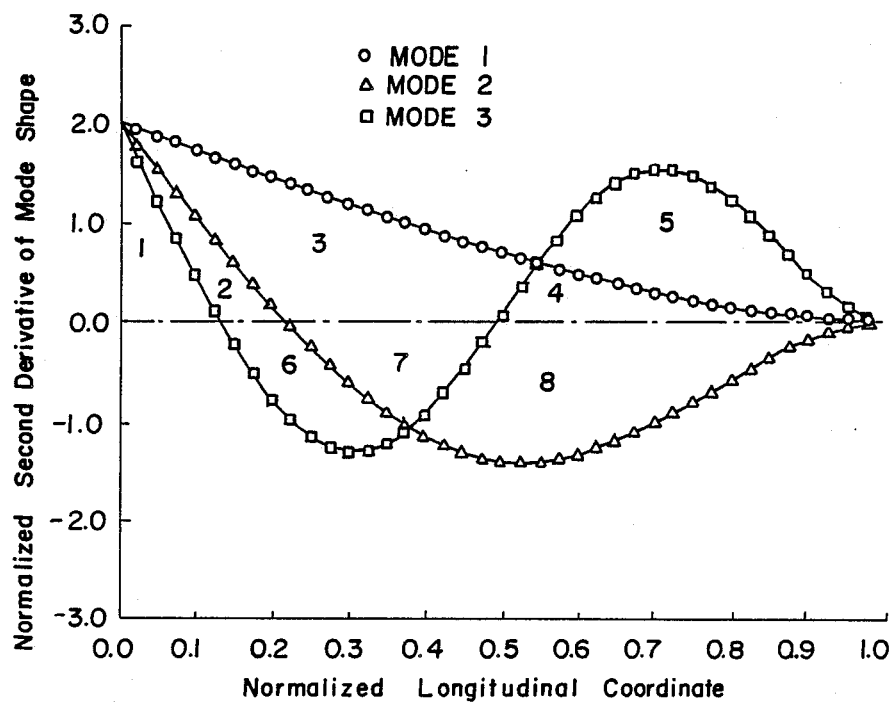
FIG. 19 is a graphical illustration of the normalized second derivative of mode shape as a function of the normalized longitudinal coordinate for modes 1, 2, and 3 of a cantilever beam.

This concept is illustrated in FIG. 19 which is a graph of the normalized second derivative of mode shape as a function of the normalized longitudinal coordinate for modes 1, 2, and 3 of a cantilever beam of length a. The normalized second derivative of mode n is given by $(a/\lambda_n)^2 d^2\Phi_n/dx^2$, while the normalized longitudinal coordinate is the longitudinal coordinate divided by the length of the beam a.

Referring to FIG. 19, the combination of segments 1 to 4 will create a mode 1 sensor, while the combination of segments 1, 2, 7, and 8 and 1, 4, 5, 6, and 7 will create a mode 2 and a mode 3 sensor, respectively. This suggests that one group of electrode segments can be used on the surface of PVDF to reveal the modal coordinate of different modes on-line in real time simply by wiring or by spatial multiplexation of the signal from different segments. The generalization of this concept is to digitize the surface electrodes across the space and use an analog-digital-converter to map the signal from each pixel into a RAM (random access memory) chip which is connected to a microprocessor. Then, all the modal coordinates can be revealed by using an internal pointer and an accumulator of the microprocessor to take the sum of all the values of each corresponding address in the RAM. This generalization provides a way to retrieve modal coordinates of different modes on-line real time without reshaping the surface electrodes.

To further confirm the analysis of PVDF laminates set forth previously, a number of experiments were performed on PVDF benders and twisters (actuators). PVDF laminate structures similar to those illustrated in FIGS. 8 and 9 were constructed, and electrical fields were applied to them to observe their response as actuators.

Theoretical results discussed previously indicate that if two PVDF thin films with a spatial uniform electrode pattern and polarization profile are combined as the two laminae shown in FIG. 8 when $\theta_1=\theta_3=0$, a PVDF bender will be created. Based on this concept, a similar configuration to that shown in of FIG. 8 was used with the exception that the poling directions of both piezoelectric laminae were in the direction of the positive z-axis. Therefore, the governing equation for this case can be obtained by adding a negative sign into Eq. (141):

$$EI\frac{\partial^4 w}{\partial x^4} + \rho h \frac{\partial^2 w}{\partial t^2} = [h_p (h_p + h_s) e_{31}^0] G(t) [\delta'(x) - \delta'(x - a)]. \quad (152)$$

This is the governing equation for a beam under negative pure bending at both ends.

Figure 20:
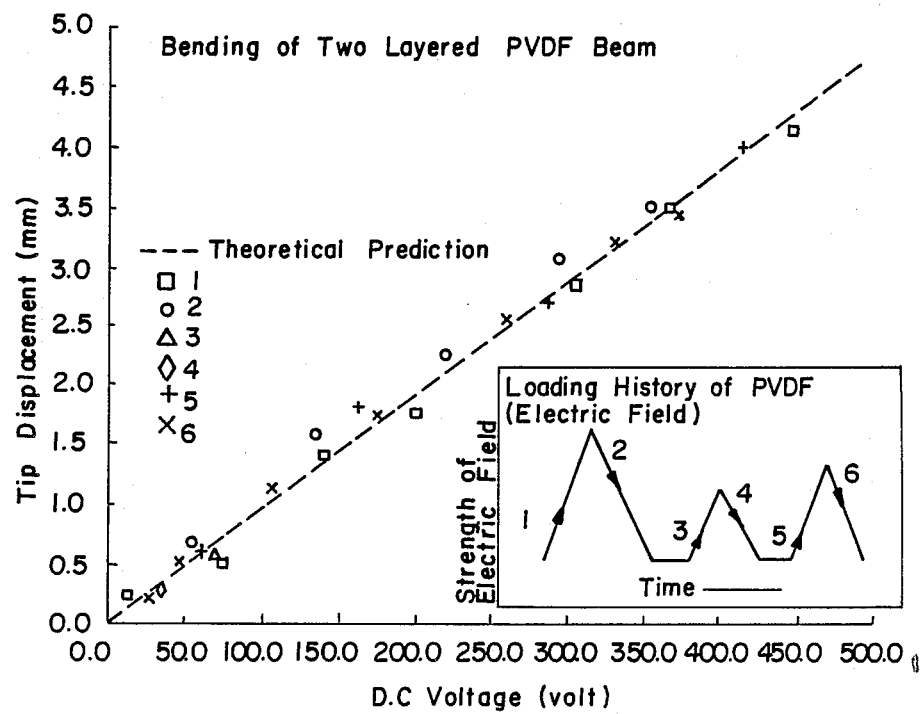
FIG. 20 is a graphical illustration of the results of a PVDF bender test showing PVDF tip displacement as a function of input voltage.

An experimental set up is designed to check the validity of Eq. (152). An 8 cm long, 1 cm wide beam is made from two layers of 110 μm thick PVDF. DC signals from a power supply are fed into the PVDF cantilever beam. The tip displacement is measured as the voltage from the power supply is increased and decreased over a period of time. The graph of the tip displacement as a function of input voltage is illustrated in FIG. 20, along with the nonscaled time history of the input voltage. As can be seen, no significant hysteris effect appears. This confirms that even neglecting the mechanical and electrical loss of PVDF as was done, precise results can still be obtained.

As further shown in FIG. 20, the experimental results agree well with the theoretically predicted results. The deflection formula used for the theoretical prediction can be calculated from Eq. (152) by setting $h_s=0$:

$$w(x) = \frac{1}{2} [d_{31'}^0 + \nu_p d_{32'}^0] \frac{V_3}{h_p^2} x^2, \quad (153)$$

where $V_3$ is the input voltage. For this particular beam:

$$w(x) = V_{3[volt]} \cdot 0.9207 \times 10^{-5} \text{ meter}. \quad (154)$$

This result indicates that the PVDF bender is only good for micro-actuation, since the amount of tip displacement obtained is small compared to the voltage input. However, from Eq. (141) the applied moment can be increased by increasing the moment arm or the thickness of PVDF. Also, Eq. (153) indicates that the displacement is inversely proportional to the square of the PVDF thickness. Thus, the displacement can be increased dramatically by reducing the thickness of the PVDF.

By changing the skew angles of the PVDF laminate used above, an actuator can be formed which can both generate twisting and bending. As before, the configuration of FIG. 8 was used, however the skew angles of the PVDF laminae were set at 45°. When a 500 volt DC signal is applied to the PVDF, bending is observed, but no twisting. After an analysis of the theoretical calculations this is not surprising, however, since it is evident that the amount of deflection due to twisting is much smaller than that due to bending. Consequently, the twisting deflection could not be observed in this experiment.

Another experiment was then devised to isolate the twisting motion. A pure twisting actuator was constructed according to the configuration illustrated in FIG. 9, with skew angles $\theta_1=-\theta_3=45°$, to form a cantilever plate. The results of the experiment showed that by sending a 34 volt peak to peak sine wave at around 90 Hz to drive the cantilever plate in its fundamental twisting mode, a twisting angle equal to ±2.05 degrees at x=7.5 cm can be achieved. These results suggest that PVDF actuators are suitable for microactuation or active damping control of torsional motions in an elastic structure.

The theoretical and experimental results developed here verified the reciprocal relationship between PVDF actuators and sensors. This suggests that the PVDF sensors and actuators can be combined to make a PVDF oscillator. The concept is similar to that used in the conventional crystal oscillator where the electric signal generated by the deformation of the piezoelectric crystal is amplified, and feedback is used to drive the crystal itself. More specifically, a PVDF sensor can be designed which picks up a particular aspect of the system motion, say twisting motion. By using an amplifier to amplify the signal and to send the amplified signal to drive the corresponding PVDF actuator, then the system will oscillate at that specific type of motion.

Figure 21:
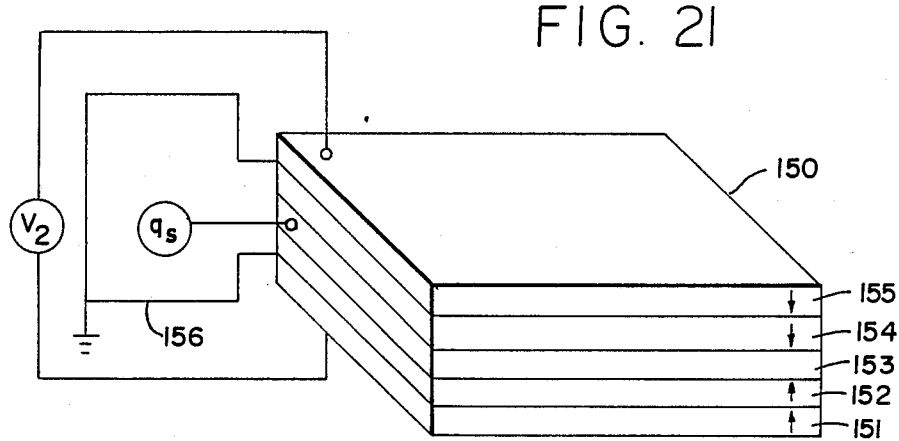
FIG. 21 is a schematic perspective illustration of a PVDF laminate constructed to form a pure twisting oscillator.

In order to demonstrate this concept, a pure twisting oscillator was built as illustrated in FIG. 21. Specifically, in FIG. 21, a PVDF laminate 150 is shown having five layers, 151, 152, 153, 154, and 155. Layers 151, 152, 154, and 155, are 110 μm thick PVDF layers, while layer 153 is a 25.4 μm shim-stock layer. Layers 151 and 155 act as actuators, and have skew angles of 45°, and —45°, respectively, and opposite poling directions. Since these are the outside layers of the laminate, their use as actuators provides a maximum moment arm. Layers 152 and 154 are sensors, and also have skew angles of 45° and —45°, respectively, and opposite poling directions.

Figure 22:
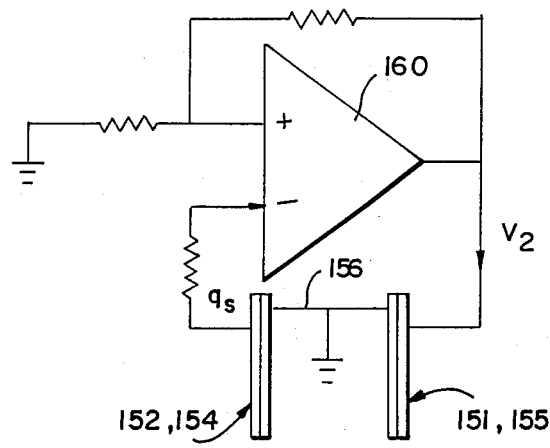
FIG. 22 is a schematic diagram illustrating the circuitry employed with the twisting oscillator of FIG. 21.

The electrical output from the sensor layers is indicated in FIG. 21 by $q_s$, while the input to the actuator layers is shown as $V_2$. A ground wire 156 is connected to laminate 150 between layers 151 and 152, and 154 and 155. FIG. 22 illustrates the circuitry used to control the oscillator. As shown, the signal $q_s$ from the PVDF sensor layers 152 and 154 is amplified through the positive feedback loop of an op amp 160, and fed back as $V_2$ to the actuator layers 151 and 155.

Experimental tests on the oscillator resulted in a 0.06° twist angle at x=7.5 cm with $V_2$ being a 24 volt peak to peak square wave at 250 Hz. The resonant frequency of the oscillator can be changed electrically by varying the resistance or the capicatance in the circuit, or in the PVDF itself. Also, the resonant frequency can be changed mechanically by varying the geometric dimensions, or the boundary conditions of the oscillator. Other types of PVDF oscillators can be built by combining different types of sensors or actuators.

Since the oscillator mentioned here is self-contained, the required circuitry is simpler, and its energy efficiency is higher than externally driven oscillators developed by previous studies. Thus, it has the potential for saving energy on a number of applications, such as on marine fouling prevention, air flow regulation, external object sensing, etc.

The oscillator structure shown in FIGS. 21 and 22 can also be used in an active damping control system such as that set forth in the Hubbard patent discussed previously. Although in the embodiment set forth in Hubbard, a layer of PVDF is used as an actuator to dampen vibrations in a beam, a second layer of PVDF is not provided to sense the vibrations. Instead, Hubbard makes use of an accelerometer or strain gauge to sense the vibrations. Since these are point sensors, the advantage of the non-uniform spatial controls cannot be fully explored due to the lack of the system response information.

Figure 23:
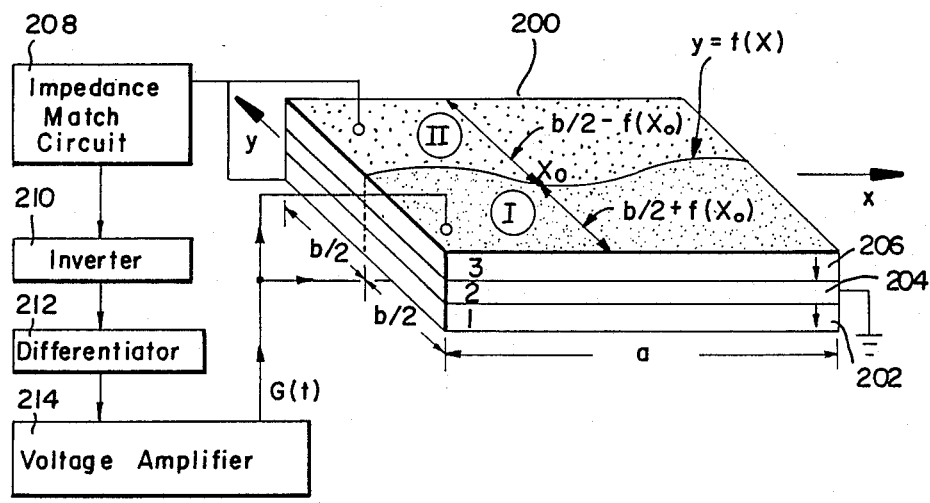
FIG. 23 is a schematic perspective illustration of a PVDF active damper structure.

Based on the reciprocal relationship of the PVDF sensor and actuator, a PVDF active damper can be constructed as shown in FIG. 23. A beam 200, of length a and width b, is made from three laminae 202, 204, and 206, according to the configuration shown in FIG. 8 with the skew angles $\theta_1 = \theta_3 = 0$. The polarization profile of the PVDF layers 202 and 206 are uniform, i.e., $P_o = 1$. The effective surface electrodes for layers 202 and 206 are separated into segments I and II. The intention is to use segment I as the actuator, and segment II as the sensor. The output from sensor segment II is fed through an impedance matching circuit 208, an inverter 210, a differentiator 212, a voltage amplifier 214, and finally back to actuator segment I.

The control algorithm, which combines the PVDF sensor and actuator to become a closed loop system, will now be derived using Lyapunov's method. Due to physical limitations, the maximum input available for feeding into the PVDF will be bounded. Thus Lyapunov's direct method can be used to derive the control schemes. One criticism about this method is that the Lyapunov function has to be guessed at to give the control scheme to make the time rate of the function at every point in time as negative as possible. However, for a system like the composite beam shown in FIG. 23, the objective is to minimize the displacement and velocity at every point of the structure. Thus the Lyapunov function can be defined as $$\mathscr{L}_f = \frac{1}{2} \int_0^a \left[ w^2 + \left( \frac{\partial w}{\partial t} \right)^2 \right] dx. \tag{155}$$

Rewriting the actuator equation (141) for this case gives:

$$\frac{\partial^2 w}{\partial t^2} = -\alpha\, G(t) \frac{d^2 \mathscr{F}_1(x)}{dx^2} - \beta \frac{\partial^4 w}{\partial x^4}, \tag{156}$$

where
$$\alpha = h_p(h_p + h_s)e_{31}^o/\rho h, \beta = EI/\rho h, \tag{157}$$

and $\mathscr{F}_1(x) = b/2 + f(x)$ according to Eq. (138).

The time derivative of the Lyapunov function may be combined with the governing Eq. (156) to give $$\frac{d\mathscr{L}_f}{dt} = \int_0^a \left[ w - \beta \frac{\partial w}{\partial t} \frac{\partial^4 w}{\partial x^4} \right] dx - \tag{158}$$

$$\alpha G \left[ \frac{\partial w}{\partial t} \frac{d\mathscr{F}_1(x)}{dx} \right]_{x=0}^a + \alpha G \int_0^a \frac{\partial^2 w}{\partial x \partial t} \frac{d\mathscr{F}_1(x)}{dx} dx.$$

The function $\alpha G(t)[\partial w/\partial t][d\mathscr{F}_1(x)/dx]$ can be identified as the boundary control term which represents the interaction of PVDF and the applied electric field at the boundaries, say $x=0$ and a. Also, $$\alpha G(t) \int_0^a [\partial^2 w/\partial x \partial t]\, [d\mathscr{F}_1(x)/dx]$$

can be identified as the internal control term which represents the interaction of PVDF and the applied electric field within the span of the beam. Further, the controllability of the control algorithm can be seen from Eq. (158) directly. Since the first term in the RHS of Eq. (158) represents the system characteristics, the application of the control signal G(t) has no effect on it. If in some cases due to the boundary conditions or the choice of $\mathscr{F}_1(x)$'s which make both the second and third terms become zero, the application of G(t) will not affect $d\mathscr{L}_f/dt$ at all. In these cases, the control algorithm will not change the system performance. More specifically, these algorithms have no controllability over the system.

Now consider the PVDF sensor equation in this case. For the case shown in FIG. 23, Eq. (139) can be rewritten as $$q_s = q_3 - q_1 = - \left[ 2z_3^o e_{31}^o\, \mathscr{F}_2(x) \frac{\partial w}{\partial x} \right]_{x=0}^a + \tag{159}$$

$$2z_3^o e_{31}^o \int_0^a \left[ \frac{\partial w}{\partial x} \frac{d\mathscr{F}_2(x)}{dx} \right] dx,$$

where $\mathscr{F}_2(x) = b/2 - f(x)$ and $z_3^o = (h_p + h_s)/2$. Now, $2 z_3^o e_{31}^o\, \mathscr{F}_2(x) [\partial w/\partial x]$ can be identified as the boundary sense term, and $2 z_3^o e_{31}^o \int_0^a [\partial w/\partial x]\, [d\mathscr{F}_2(x)/dx]dx$ as the internal sense term.

Comparing Eqs. (158) and (159) it is known that if $x=0$ and a are fixed ends, i.e., $w = \partial w/\partial x = 0$, then both the boundary control and boundary sense terms will be zero. Equations (158) and (159) will thus become:

$$\frac{d\mathscr{L}_f}{dt} = \int_0^a \left[ w - \beta \frac{\partial w}{\partial t} \frac{\partial^4 w}{\partial x^4} \right] dx + \tag{160}$$

$$\alpha G(t) \int_0^a \frac{\partial^2 w}{\partial x \partial t} \frac{d\mathscr{F}_1}{dx} dx$$

and $$q_s = (h_p + h_s) e_{31}^0 \int_0^a \left[ \frac{\partial w}{\partial x} \frac{d \phi_2}{dx} \right] dx. \quad (161)$$

Combining these two equations and the fact that $d\phi_1(x)/dx = -d\phi_2(x)/dx$, $d\mathcal{L}_f/dt$ can be rewritten as follows:

$$\frac{d \mathcal{L}_f}{dt} = \int_0^a \left[ w - \beta \frac{\partial w}{\partial t} \frac{\partial^4 w}{\partial x^4} \right] dx - \frac{h_p}{\rho h} G(t) \left[ \frac{dq_s}{dt} \right]. \quad (162)$$

Based on the concept of Lyapunov's direct method, $G(t)$ needs to be designed to minimize $d\mathcal{L}_f/dt$. Therefore, if nonlinear control is consider, this goal can be achieved by choosing $$G(t) = +\text{sgn}\left[ \frac{dq_s}{dt} \right] \cdot V_a \quad (163)$$

where $V_a$ is the available maximum voltage and the sign function sgn(x) is defined as follows:

$$\text{sgn}(x) = \begin{array}{l} 1 ; \text{if } x > 0, \\ -1 ; \text{if } x < 0. \end{array} \quad (164)$$

This is a bang-bang type of control. If a constant gain control is chosen, then the control signal $G(t)$ can be chosen as follows:

$$G(t) = +\text{gain} \cdot \left[ \frac{dq_s}{dt} \right] \quad (165)$$

Both algorithms can be implemented immediately by using different types of voltage amplifiers in FIG. 23. Due to the sign convention of $q_s$, inverter 210 is needed to satisfy Eqs. (163, 165) in this set-up. However, the inverter can be omitted by reversing the output polarity of impedance matching circuit 208.

In the above derivations, Lyapunov's direct method was used to derive the algorithm for the control signal $G(t)$, the time dependent part of the control algorithm. However, the spatial dependent part of the algorithm, i.e. the surface electrode pattern, has be be designed beforehand. This approach allows the control task to be separated into two parts. The spatial dependent part of the algorithm depends on which part of the system dynamics is to be controlled. For example, if an independent modal control is desired, the electrode pattern of both sensor and actuator has to be the second derivative of a particular mode. On the other hand, the time dependent part will be varied according to the system response on-line in real time. Another thing that should be noted is that according to Eq. (162), the PVDF active damper proposed in FIG. 23 automatically becomes a co-located position sensor and a corresponding actuator due to the reciprocal relationship between the PVDF sensor and actuator. In other words, on-line real time signal processing efforts are not required. The PVDF sensor is performing signal processing automatically. A fact that should be noted is that the PVDF sensor and actuator do not necessarily have to be in the same layer as the case shown in FIG. 23. They can be located in different layers like the PVDF oscillator shown in FIG. 21.

Using the general structure shown in FIG. 21, Lyapunov's direct method can be calculated for an elastic plate. If the structure shown in FIG. 21 is considered to be a PVDF active damper, the actuator equation can be obtained by first replacing the moment arm $(h_p+h_s)/2$ in Eqs. (105–107) with the moment arm for this case, $(h_s+3h_p)/2$, which is obtained from Eq. (61). Once the coefficients are redefined which relate the moment resultants and the applied electric field as:

$$[R_{31}, R_{32}, R_{36}]^t = h_p [e_{31}^o, e_{32}^o, e_{36}^o]^t \cdot (h_s + 3h_p)/2, \quad (166)$$

the actuator equation will have the same form as Eq. (109):

$$\rho h \frac{\partial^2 w}{\partial t^2} = -D_{11} \nabla^4 w + l - \quad (167)$$

$$(V_3)_2(t) \left[ R_{31} \frac{\partial^2 (FP_o)}{\partial x^2} + R_{32} \frac{\partial^2 (FP_o)}{\partial y^2} + 2 R_{36} \frac{\partial^2 (FP_o)}{\partial x \partial y} \right],$$

where $\nabla^4 = \nabla^2 \nabla^2$. The $e_{31}^o$, $e_{32}^o$, and $e_{36}^o$ are the piezoelectric stress/charge constant with respect to the laminate axes defined in Eq. (131). Therefore, if Lyapunov's function is chosen as follows:

$$\mathcal{L}_f = \frac{1}{2} \int_S \left[ w^2 + \left( \frac{\partial w}{\partial t} \right)^2 \right] d\sigma \quad (168)$$

where S is the area of the plate and $d\sigma$ is the differential area element, then the time derivative of the Lyapunov function combined with Eq. (167) gives $$\frac{\partial \mathcal{L}_f}{dt} = \int_S \left[ w \frac{\partial w}{\partial t} + \frac{1}{\rho h} \frac{\partial w}{\partial t} (l - D_{11} \nabla^4 w) \right] d\sigma - \quad (169)$$

$$\frac{1}{\rho h} (V_3)_2 \int_S \frac{\partial w}{\partial t} \left[ R_{31} \frac{\partial^2 (FP_o)}{\partial x^2} + R_{32} \frac{\partial^2 (FP_o)}{\partial y^2} + 2R_{36} \frac{\partial^2 (FP_o)}{\partial x \partial y} \right] d\sigma.$$

Again, the first term of the RHS of Eq. (169) is the system characteristics and the change of $(V_3)_2(t)$ will not have any effect; the control by the PVDF actuator is indicated in the second term of the RHS in Eq. (169). This term includes both the boundary and internal control terms.

For ease of explanation, consider the spatial uniform case, i.e. only the boundary control term remains. For the spatial uniform case:

$$FP_o = [H(x) - H(x-a)] \left[ H\left(y + \frac{b}{2}\right) - H\left(y - \frac{b}{2}\right) \right]. \quad (170)$$

Substituting Eq. (170) into Eq. (169) yields that $$\frac{\partial \mathscr{L}_f}{dt} = \int_S \left[ w \frac{\partial w}{\partial t} + \frac{1}{\rho h} \frac{\partial w}{\partial t} (l - D_{11} \nabla^4 w) \right] d\sigma - \tag{171}$$

$$\frac{1}{\rho h} (V_3)_2 \left\{ R_{31} \int_{-b/2}^{b/2} \left[ \frac{\partial^2 w}{\partial x \partial y} \right]_{x=0}^{a} dy + \right.$$

$$R_{32} \int_0^a \left[ \frac{\partial^2 w}{\partial y \partial t} \right]_{y=-b/2}^{b/2} dx + 2 R_{36} \left[ \frac{\partial w(0, -b/2, t)}{\partial t} - \right.$$

$$\left. \partial w \frac{(a, -b/2, t)}{\partial t} + \frac{\partial w(a, b/2, t)}{\partial t} - \frac{\partial w(0, b/2, t)}{\partial t} \right] \right\} d\sigma.$$

Equation (171) indicates that the actuator signal $(V_3)_2(t)$ has to be chosen according to the integral of the angular velocity along the boundary, and the velocity at the four corners in order to make $\partial \mathscr{L}_f / \partial t$ as negative as possible. This can be achieved by examining the sensor signals in this case. Substituting (170) into Eq. (134) and performing integration yields that $$q_s = q_4 - q_2 = -2 z_4^o \left\{ e_{31}^0 \int_{-b/2}^{b/2} \left[ \frac{\partial w}{\partial x} \right]_{x=0}^{a} dy + \right. \tag{172}$$

$$e_{32}^0 \int_{-b/2}^{b/2} \left[ \frac{\partial w}{\partial y} \right]_{y=-b/2}^{b/2} dx +$$

$$\left. 2 e_{36}^0 [w(0, -b/2, t) - w(s, -b/2, t) + w(a, b/2, t) - w(0, b/2, t)] \right\}$$

where $z_4^o = (h_p + h_s)/2$. Substituting Eqs. (166) and (172) into Eq. (171) gives $$\frac{\partial \mathscr{L}_f}{dt} = \int_S \left[ w \frac{\partial w}{\partial t} + \frac{1}{\rho h} \frac{\partial w}{\partial t} (l - D_{11} \nabla^4 w) \right] d\sigma + \tag{173}$$

$$\left( \frac{1}{\rho h} \right)\left( \frac{h_p}{2} \right)\left( \frac{h_s + 3h_p}{h_s + h_p} \right)(V_3)_2 \frac{dq_s}{dt}.$$

Therefore, either the nonlinear bang-bang control, $$(V_3)_2(t) = -\operatorname{sgn}\left[ \frac{dq_s}{dt} \right], \text{ i.e., } (V_3)_2(t) \sim \operatorname{sgn}\left[ \frac{d(V_3)_1}{dt} \right], \tag{174}$$

or the linear control, $$(V_3)_2(t) = -\operatorname{gain} \cdot \left[ \frac{dq_s}{dt} \right], \text{ i.e., } (V_3)_2(t) \sim -\left[ \frac{d(V_3)_1}{dt} \right]. \tag{175}$$

can be chosen to minimize $\partial \mathscr{L}_f / \partial t$. Again, if the boundaries are fixed, i.e. $q_s = (V_3)_1 = 0$, the system is noncontrollable by this scheme. In other words, the controllability of this system can be examined by Eq. (173). The above derivation indicates that due to the reciprocal relationship of the PVDF sensors and actuators, these sensors and actuators are fully compatible, such that almost all on-board real time signal processing effects can be transferred to the design stage.

These types of active vibration control dampers can be used in a variety of applications. One specific application is in the control of vibrations in the suspension of computer disk files. By integrating a PVDF laminate structure such as that illustrated in FIG. 21, for example, into the suspension structure itself, the suspension vibrations can be both monitored and controlled in real time, without any signal processing requirements. Clearly, such a capability makes the device invaluable in this application, and in many other applications as well.

Although the invention has been illustrated in terms of preferred embodiments, it will be understood that numerous variations and modifications can be made by those of skill in the art without departing from the true spirit and scope of the inventive concepts as set forth in the following claims.

We claim:

1. Apparatus for sensing and controlling complex motions in a mechanical structure comprising:
    an integrated distributed piezoelectric sensor/actuator for attachment to a mechanical structure including:
    a laminate comprising at least four stacked laminae of piezoelectric material; each of said lamina having top and bottom sides, a thickness, and a principal axis defining the direction along which the top side of the lamina will contract or expand relative to the bottom side of the lamina upon application of an electrical signal across the thickness of the lamina, and conversely defining the direction along which when the lamina is contracted or expanded, an electrical signal will be generated across the thickness thereof;
    wherein a first pair of said at least four laminae have their principal axes skewed with respect to one another and include means to sense electrical signals generated across the thicknesses thereof in response to stress or strain applied thereto; and,
    a second pair of said at least four laminae have their principal axes skewed with respect to one another and include means to supply electrical signals across the thicknesses thereof to impart bending motions to the second pair of laminae; whereby,
    when the laminate is attached to a mechanical structure, both bending and torsional motions of the structure can be determined without signal processing from signals generated by the first pair of laminae, and bending and torsional motions can be generated in the mechanical structure by supplying electrical signals to the second pair of laminae.

2. The apparatus of claim 1, wherein each of said lamina is formed from a thin film polymeric piezoelectric material.

3. The apparatus of claim 2, wherein said thin film polymeric piezoelectric material is polyvinylidene fluoride.

4. The apparatus of claim 1, further including circuit means responsive to the sensed electric signals generated by said first pair of laminae to generate appropriate electrical signals for application to a second pair of laminae which will impart complex motions in the second pair of laminae, and therefore in a mechanical structure to which the laminate is attached, that will counteract, and therefore dampen, the complex motions sensed by the first pair of laminae.

5. The apparatus of claim 1, further including circuit means responsive to the sensed electrical signals from said first pair of laminae to generate appropriate electrical signals for application to said second pair of laminae which will cause the laminate, and a mechanical structure to which it is attached, to undergo an oscillatory motion.

6. The apparatus of claim 1, wherein said means to sense electrical signals generated across the thicknesses of said first pair of laminae, and said means to supply electrical signals across the thicknesses of said second pair of laminae, comprise flat surface electrodes that are disposed on the top and bottom sides of each of the lamina.

7. The apparatus of claim 6, wherein said surface electrodes are shaped to cause each of the lamina in the first pair of laminae to be responsive to only particular components of motion, and each of the lamina in the second pair of laminae to generate only particular components of motion.

8. The apparatus of claim 7, wherein the particular components of motion sensed or generated, are bending modes.

9. The apparatus of claim 1, wherein each of said lamina is polarized.

10. The apparatus of claim 9, wherein the polarization profile of each of said lamina is uniform.

11. The apparatus of claim 9, wherein the polarization profile of each of said lamina is varied in magnitude and direction to vary the response characteristics of the lamina.

12. The apparatus of claim 1, further including
a mechanical structure to which said laminate is to be attached, and the complex motions of which are to be sensed and controlled; and,
means to attach said laminate to said mechanical structure.

13. The apparatus of claim 12, wherein said mechanical structure is a computer disk file suspension.

14. Apparatus for sensing complex motions in a mechanical structure comprising:
an integrated distributed piezoelectric sensor which includes:
a laminate having at least a first and a second lamina of piezoelectric material; each of said lamina having top and bottom sides, a thickness, and a principal axis defining the direction along which when the top side of the lamina is contracted or expanded relative to the bottom side of the lamina, an electrical signal will be generated across the thickness thereof;
wherein, said first and second lamina have their principal axes skewed with respect to one another and include means to sense electrical signals generated across the thickness thereof in response to stress or strain applied thereto;
whereby, when the laminate is attached to a mechanical structure, the torsional and bending motions of which are to be sensed, the lamina will generate electrical signals, from which the magnitude and direction of the torsional and bending motions can be determined without signal processing.

15. The apparatus of claim 14, wherein the laminae are formed from thin film polymeric piezoelectric material.

16. The apparatus of claim 15, wherein the thin film polymeric piezoelectric material is polyvinylidene fluoride.

17. The apparatus of claim 14, wherein said means to sense electrical signals generated across the thicknesses of the laminae comprise flat surface electrodes that are disposed on the top and bottom sides of each of the lamina.

18. The apparatus of claim 17, wherein said surface electrodes are shaped to cause each of the lamina to be responsive only to particular components of motion.

19. The apparatus of claim 17, wherein the particular components of motion sensed are bending modes.

20. The apparatus of claim 14, wherein each of said lamina is polarized.

21. The apparatus of claim 20, wherein the polarization profile of each of said lamina is uniform.

22. The apparatus of claim 20, wherein the polarization profile of each of said lamina is varied in magnitude and direction to vary the response characteristics of the lamina.

23. The apparatus of claim 14, further including
a mechanical structure to which said laminate is to be attached, and the complex motions of which are to be sensed; and,
means to attach said laminate to said mechanical structure.

24. The apparatus of claim 23, wherein said mechanical structure is a computer disk file suspension.

25. Apparatus for generating complex motions in a mechanical structure comprising: an integrated distributed piezoelectric actuator which includes:
a laminate having at least a first and a second lamina of piezoelectric material; each of said lamina having top and bottom sides, a thickness, and a principal axis defining the direction along which the top side of the lamina will contract or expand relative to the bottom side of the lamina upon application of an electrical signal across the thickness of the lamina;
wherein, said first and second laminae have their principal axes skewed with respect to one another and include means to apply electrical signals across the thicknesses thereof;
whereby, when the laminate is attached to a mechanical structure, bending and torsional motions can be generated in the structure through application of electrical signals to the laminae.

26. The apparatus of claim 25, wherein each of said lamina is formed from a thin film polymeric piezoelectric material.

27. The apparatus of claim 26, wherein said thin film polymeric piezoelectric material is polyvinylidene fluoride.

28. The apparatus of claim 25, wherein said means to apply electrical signals across the thicknesses of said first and second laminae, comprise flat surface electrodes that are disposed on the top and bottom sides of each of the lamina.

29. The apparatus of claim 28, wherein said surface electrodes are shaped to cause each of the lamina to generate only particular components of motion.

30. The apparatus of claim 29, wherein the particular components of motion generated, are bending modes.

31. The apparatus of claim 25, wherein each of said lamina is polarized.

32. The apparatus of claim 31, wherein the polarization profile of each of said lamina is uniform.

33. The apparatus of claim 31, wherein the polarization profile of each of said lamina is varied in magnitude and direction to vary the response characteristics of the lamina.

34. The apparatus of claim 25, further including a mechanical structure to which said laminate is to be attached, and in which complex motions are to be generated; and, means to attach said laminate to said mechanical structure.

35. The apparatus of claim 34, wherein said mechanical structure is a computer disk file suspension.

36. Apparatus for sensing or generating particular components of motion in a mechanical structure comprising an integrated distributed piezoelectric sensor or actuator including:

at least a first layer of polarized piezoelectric material for attachment to a mechanical structure, said piezoelectric material having top and bottom sides, and a thickness; and, surface electrode means disposed on the top and bottom sides of said layer for either sensing an electrical signal generated across the thickness of the layer in response to stress and strain imparted to the layer from the motions of a mechanical structure to which the layer is attached, or supplying an electrical signal to the layer for imparting stress or strain thereto;

said surface electrode means being shaped to control the particular components of motion to which the sensor or actuator is responsive; and, the direction and magnitude of the polarization of said layer being nonuniform throughout the layer to further control the particular components of motion to which the sensor or actuator is responsive.

37. The apparatus of claim 36, wherein the polarization of a first portion of the layer of piezoelectric material is in a first direction, and the polarization of a second portion of the layer of piezoelectric material is in an opposite direction.

38. Apparatus for sensing or generating particular components of motion in a mechanical structure comprising an integrated distributed piezoelectric sensor or actuator including:

at least a first layer of piezoelectric material for attachment to a mechanical structure, said piezoelectric material having top and bottom sides, and a thickness; and, said layer being divided into first and second sections;

surface electrode means disposed on the top and bottom sides of said first and second sections of said layer for either sensing an electrical signal generated across the thickness of the layer in response to stress and strain imparted to the layer from the motions of a mechanical structure to which the layer is attached, or supplying an electrical signal to the layer for imparting stress or strain thereto;

said surface electrode means being shaped to control the particular components of motion to which the sensor or actuator is responsive; and, means to electrically connect the top surface electrode means of said first section to the bottom surface electrode means of said second section, and the top surface electrode means of said second section to the bottom surface electrode means of said first section; whereby, the polarities of the first and second sections are opposite to one another so that the particular components of motion to which the sensor or actuator is responsive are further varied.

39. Apparatus for sensing or generating particular components of motion in a mechanical structure comprising an integrated distributed piezoelectric sensor or actuator including:

at least a first layer of piezoelectric material for attachment to a mechanical structure, said piezoelectric material having top and bottom sides, and a thickness; and, surface electrode means disposed on the top and bottom sides of said layer for either sensing an electrical signal generated across the thickness of the layer in response to stress and strain imparted to the layer from the motions of a mechanical structure to which the layer is attached, or supplying an electrical signal to the layer for imparting stress or strain thereto:

said surface electrode means being shaped to control the particular components of motion to which the sensor or actuator is responsive, and being separated into segments which can be selectively combined electrically to create a sensor or actuator that is responsive to more than one component of motion.

40. Apparatus for sensing or generating particular components of motion in a mechanical structure comprising an integrated distributed piezoelectric sensor or actuator including:

at least a first and a second layer of piezoelectric material for attachment to a mechanical structure, said piezoelectric material layers each having top and bottom sides, and a thickness;

surface electrode means disposed on the top and bottom sides of each said layer for either sensing an electrical signal generated across the thickness of each of the layers in response to stress and strain imparted to the layers from the motions of a mechanical structure to which the layers are attached, or supplying an electrical signal to the layers for imparting stress or strain thereto;

said surface electrode means being shaped to control the particular components of motion to which the sensor or actuator is responsive;

means to attach said first and second layers of piezoelectric material together to form a laminate which is a sensor or actuator that is responsive to more than one particular component of motion.

41. The apparatus of claim 39, wherein the components of motion to be sensed or generated are bending modes.

42. The apparatus of claim 40, wherein the components of motion to be sensed or generated are bending modes.

43. Apparatus for sensing and controlling complex motions in a mechanical structure comprising: an integrated distributed piezoelectric sensor/actuator for attachment to a mechanical structure including:

a laminate having at least two laminae of piezoelectric material, each of said lamina having top and bottom sides, a thickness, and a principal axis defining the direction along which the top side of the lamina will contract or expand relative to the bottom side of the lamina upon application of an electric signal across the thickness of the lamina, and conversely defining the direction along which when the lamina is contracted or expanded, an electrical signal will be generated across the thickness thereof;

wherein each of said lamina have their principal axes skewed with respect to one another and each include means to sense electrical signals generated across the thickness thereof in response to stress or strain applied thereto, and means to supply electrical signals across the thickness thereof to impart motions to each of the lamina; whereby, when the laminate is attached to a mechanical structure, the complex motions of the structure can be sensed and controlled by the laminate without signal processing.

44. The apparatus of claim 43, wherein each of said lamina is formed from a thin film polymeric piezoelectric material.

45. The apparatus of claim 44, wherein said thin film polymeric piezoelectric material is polyvinylidene fluoride.

46. The apparatus of claim 43, further including circuit means responsive to the sensed electric signals generated by the laminae to generate appropriate electrical signals for application to the laminae which will impart complex motions in the laminae, and therefore in a mechanical structure to which the laminate is attached, that will counteract, and therefore dampen, the complex motions sensed by the laminae.

47. The apparatus of claim 43, further including circuit means responsive to the sensed electrical signals from said laminae to generate appropriate electrical signals for application to said laminae which will cause the laminate, and a mechanical structure to which it is attached, to undergo an oscillatory motion.

48. The apparatus of claim 43, wherein said means to sense electrical signals generated across the thicknesses of said laminae, and said means to supply electrical signals across the thicknesses of said laminae, comprise flat surface electrodes that are disposed on the top and bottom sides of each of the lamina.

49. The apparatus of claim 43, further including a mechanical structure to which said laminate is to be attached, and the complex motions of which are to be sensed and controlled; and, means to attached said laminate to said mechanical structure.

50. The apparatus of claims 43, wherein said mechanical structure is a computer disk file suspension.

51. A method for sensing and/or controlling complex motions in a mechanical structure comprising the steps of;

forming an integrated distributed piezoelectric sensor/actuator from at least a first layer of piezoelectric material which generates an output, in response to complex motions imparted thereto, that does not require signal processing, and conversely which generates complex motions in response to an input signal;

varying the polarization profile of the piezoelectric material layer to vary its response characteristics;

attaching said integrated distributed piezoelectric sensor/actuator to a mechanical structure whose complex motions are to be sensed or controlled; and, determining from the output generated by the sensor/actuator, the complex components of motion of a mechanical structure to which the sensor/actuator is attached, and/or supplying an electric signal to the sensor/actuator to impart complex motions to a mechanical structure to which the piezoelectric sensor/actuator is attached.

52. A method for sensing and/or controlling complex motions in a mechanical structure comprising the steps of;

forming an integrated distributed piezoelectric sensor/actuator which generates an output, in response to complex motions impared thereto, that does not require signal processing, and conversely which generates complex motions in response to an input signal; said step of forming comprising:

(a) forming a flexible laminate from a plurality of piezoelectric material layers so that at least two of said layers have principal axes which are skewed with respect to one another; where the principal axis defines the direction along which a top side of a layer will contract or expand relative to a bottom side of a layer upon application of an electric signal across a thickness of the layer, and conversely defining the direction along which when the layer is contracted or expanded, an electrical signal will be generated across the thickness thereof;

(b) disposing surface electrodes on opposite sides of each said piezoelectric material layers and shaping said surface electrodes to cause the laminate to be responsive to particular components of motion; and, (c) varying the polarization profile of each said piezoelectric material layer to further vary the response characteristics of said laminate;

attaching said integrated distributed piezoelectric sensor/actuator to a mechanical structure whose complex motions are to be sensed or controlled; and, determinig from the output generated by the sensor/actuator, the complex components of motion of a mechanical structure to which the sensor/actuator is attached, and/or supplying an electrical signal to the sensor/actuator to impart complex motions in a mechanical structure to which the piezoelectric sensor/actuator is attached.

53. The apparatus of claim 40, further including circuit means responsive to electrical signals generated by said laminate in response to particular components of motion imparted thereto, to generate appropriate electrical signals for application to the laminate which will impart particular components of motion therein, and therefore in a mechanical structure to which the laminate is attached, that will counteract, and therefore dampen, particular components of motion sensed by the laminate.

54. A piezoelectric sensor/actuator that is responsive to selected bending modes in a mechanical structure comprising:

at least a first layer of piezoelectric material having a length defining an x axis; a width defining a y axis; a thickness defining a z axis; and top and bottom sides; and, means to cause said sensor/actuator to be responsive to, or generate, only selected bending modes comprising first and second surface electrodes disposed on said top and bottom sides for either sensing an electrical signal generated across the thickness of the layer in response to stress and strain imparted to the layer by bending about the y axis, or supplying an electrical signal to the layer to cause it to bend about the y axis;

each said surface electrode means having a shape defined by the area between a curve of a function $F(x)$ and the x axis, where $F(x)$ is directly proportional to the second derivative of a mode shape function $\phi_n(x)$, where $\phi_n(x)$ defines the displacement in the z direction of said layer as a function of x for a selected bending mode n, where n = 1, 2, 3, etc.

* * * * *